(12) United States Patent
Jung et al.

(10) Patent No.: US 12,495,588 B2
(45) Date of Patent: Dec. 9, 2025

(54) SEMICONDUCTOR DEVICE

(71) Applicant: SAMSUNG ELECTRONICS CO., LTD., Suwon-si (KR)

(72) Inventors: Su Jin Jung, Hwaseong-si (KR); Jin Bum Kim, Seoul (KR); Da Hye Kim, Seoul (KR); In Gyu Jang, Seoul (KR); Dong Suk Shin, Suwon-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 757 days.

(21) Appl. No.: 17/709,936

(22) Filed: Mar. 31, 2022

(65) Prior Publication Data

US 2022/0406892 A1 Dec. 22, 2022

(30) Foreign Application Priority Data

Jun. 16, 2021 (KR) .................. 10-2021-0077968

(51) Int. Cl.
*H10D 62/10* (2025.01)
*H10D 30/67* (2025.01)
*H10D 64/01* (2025.01)

(52) U.S. Cl.
CPC ....... *H10D 62/118* (2025.01); *H10D 30/6713* (2025.01); *H10D 30/6757* (2025.01); *H10D 64/018* (2025.01)

(58) Field of Classification Search
None
See application file for complete search history.

(56) References Cited

U.S. PATENT DOCUMENTS

| | | | |
|---|---|---|---|
| 8,987,794 B2 | 3/2015 | Rachmady et al. |
| 9,947,804 B1 | 4/2018 | Frougier et al. |
| 10,079,305 B2 | 9/2018 | Lee et al. |
| 10,453,824 B1 | 10/2019 | Mochizuki et al. |
| 10,658,483 B2 | 5/2020 | Leobandung |
| 10,672,891 B2 | 6/2020 | Hashemi et al. |

(Continued)

OTHER PUBLICATIONS

Office Action in Korean Appln. No. 10-2021-0077968, mailed on May 20, 2025, 17 pages (with English translation).

*Primary Examiner* — Yara B Green
*Assistant Examiner* — Fakeha Sehar
(74) *Attorney, Agent, or Firm* — Fish & Richardson P.C.

(57) ABSTRACT

A semiconductor device is provided. A semiconductor device comprising a first active pattern including a first lower pattern and a plurality of first sheet patterns spaced apart from the first lower pattern in a first direction and having a first source/drain recess formed therein, a first source/drain pattern filling the first source/drain recess and in contact with the first sheet patterns on the first lower pattern, and first gate structures disposed on both sides of the first source/drain pattern in a second direction different from the first direction and each including first gate electrodes each surrounding the plurality of first sheet patterns, wherein the first source/drain pattern includes a first region on the first lower pattern, second regions including impurities of a conductivity type different from that of the first region and in contact with the first region and side surfaces of the first sheet patterns, and a third region between the second regions, and a thickness of the first region in the first direction is greater than a thickness of the second region.

12 Claims, 21 Drawing Sheets

(56) References Cited

U.S. PATENT DOCUMENTS

| | | |
|---|---|---|
| 10,872,953 B2 | 12/2020 | Reznicek et al. |
| 11,996,484 B2 * | 5/2024 | Lin .................. H01L 29/42392 |
| 12,040,405 B2 * | 7/2024 | Lin ................. H01L 21/823814 |
| 2016/0240441 A1 | 8/2016 | Kang et al. |
| 2017/0294436 A1 * | 10/2017 | Chang ................. H01L 29/0657 |
| 2018/0294331 A1 | 10/2018 | Cho et al. |
| 2020/0220018 A1 | 7/2020 | Jang et al. |
| 2020/0287039 A1 | 9/2020 | Bi et al. |
| 2020/0388682 A1 | 12/2020 | Jeong et al. |
| 2021/0126106 A1 * | 4/2021 | Wang .................. H01L 29/6656 |
| 2021/0126135 A1 * | 4/2021 | Lee ..................... H10D 30/014 |
| 2022/0131014 A1 * | 4/2022 | Lai ...................... H01L 29/7848 |
| 2022/0367683 A1 * | 11/2022 | Chen ................... H10B 10/125 |

* cited by examiner

SEMICONDUCTOR DEVICE

CROSS-REFERENCE TO RELATED APPLICATION

This application claims priority under 35 U.S.C. 119 from Korean Patent Application No. 10-2021-0077968 filed on Jun. 16, 2021 in the Korean Intellectual Property Office, the subject matter of which is incorporated herein in its entirety.

BACKGROUND

1. Technical Field

The present disclosure relates to a semiconductor device, and more particularly, to a semiconductor device including a multi-bridge channel field effect transistor (MBCFET™).

2. Description of the Related Art

As one the of scaling technologies for increasing a density of a semiconductor device, a multi-gate transistor in which a multi-channel active pattern (or a silicon body) having a fin or nanowire shape is formed on a substrate and gates are formed on a surface of the multi-channel active pattern has been proposed.

Such a multi-gate transistor uses a three-dimensional channel, and it is thus easy to scale. In addition, current control capabilities may be improved without increasing a gate length of the multi-gate transistor. Furthermore, a short channel effect (SCE) in which a potential of a channel region is affected by a drain voltage may be effectively suppressed.

SUMMARY

Aspects of the present disclosure provide a semiconductor device capable of having improved performance and reliability.

According to an embodiment of the present disclosure, there is provided a semiconductor device comprising a first active pattern including a first lower pattern and a plurality of first sheet patterns spaced apart from the first lower pattern in a first direction and having a first source/drain recess formed therein, a first source/drain pattern filling the first source/drain recess and in contact with the first sheet patterns on the first lower pattern, and first gate structures disposed on both sides of the first source/drain pattern in a second direction different from the first direction and each including first gate electrodes each surrounding the plurality of first sheet patterns, wherein the first source/drain pattern includes a first region on the first lower pattern, second regions including impurities of a conductivity type different from that of the first region and in contact with the first region and side surfaces of the first sheet patterns, and a third region between the second regions, and a thickness of the first region in the first direction is greater than a thickness of the second region.

According to an embodiment of the present disclosure, there is provided a semiconductor device comprising a first active pattern including a first lower pattern and a plurality of first sheet patterns spaced apart from the first lower pattern in a first direction and disposed in an N-channel metal oxide semiconductor (NMOS) region, a first source/drain pattern disposed on the first lower pattern and in contact with the first sheet patterns, first gate structures disposed on both sides of the first source/drain pattern in a second direction different from the first direction and each including first gate electrodes each surrounding the plurality of first sheet patterns, a second active pattern including a second lower pattern and a plurality of second sheet patterns and disposed in a P-channel metal oxide semiconductor (PMOS) region, a second source/drain pattern disposed on the second lower pattern and in contact with the second sheet patterns, and second gate structures disposed on both sides of the second source/drain pattern, wherein the first source/drain pattern is disposed in a first source/drain recess, the second source/drain pattern is disposed in a second source/drain recess, the first source/drain pattern includes a first region on the first lower pattern, a plurality of second regions spaced apart from each other on the first region and on side surfaces of the first sheet patterns, and a third region between the plurality of second regions, and a depth of the first source/drain recess is greater than a depth of the second source/drain recess.

According to an embodiment of the present disclosure, there is provided a semiconductor device comprising, a first active pattern including a first lower pattern and a plurality of first sheet patterns spaced apart from the first lower pattern in a first direction, a plurality of first gate structures spaced apart from each other in a second direction different from the first direction on the first lower pattern and each including first gate electrodes, each of which surrounds the plurality of first sheet patterns, a first source/drain recess defined between the first gate structures adjacent to each other in the first direction, and a first source/drain pattern disposed in the first source/drain recess on the first lower pattern, wherein the first gate structure further includes a first inner spacer between the first sheet patterns adjacent to each other in the first direction, the first source/drain pattern includes a first region on the first lower pattern, a plurality of second regions spaced apart from each other on the first region and on side surfaces of the first sheet patterns, and a third region between the plurality of second regions, and the first to third regions are sequentially disposed along the first direction, and the second and third regions are sequentially disposed along the second direction.

However, aspects of the present disclosure are not restricted to the examples set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

A semiconductor device according to some exemplary embodiments may include a tunneling field effect transistor (FET), a three-dimensional (3D) FET, or a two-dimensional material-based FET, and a heterostructure thereof. In addition, the semiconductor device according to some exemplary embodiments may include a bipolar junction transistor, a lateral double-diffused metal oxide semiconductor (LDMOS) transistor, or the like.

A semiconductor device according to some exemplary embodiments will be described with reference to FIGS. 1 to 4.

Figure 1:
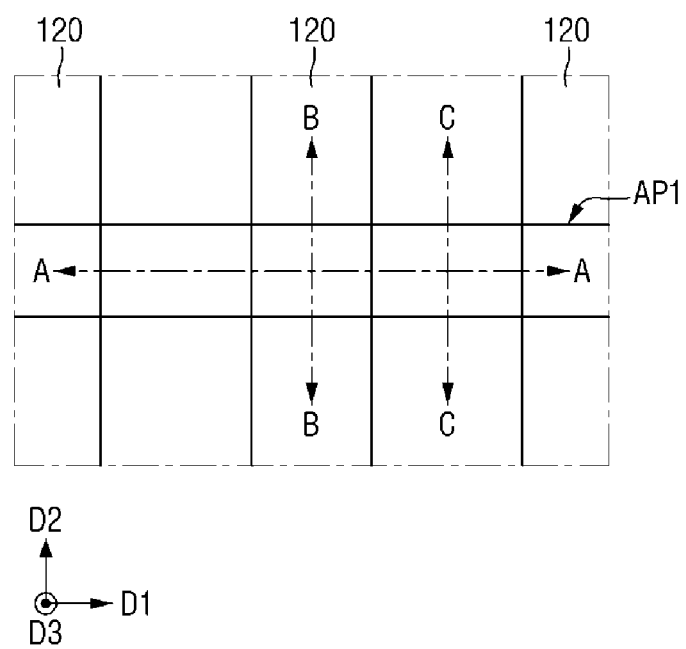
FIG. 1 is an exemplary layout diagram for describing a semiconductor device according to some exemplary embodiments.
Figure 2:
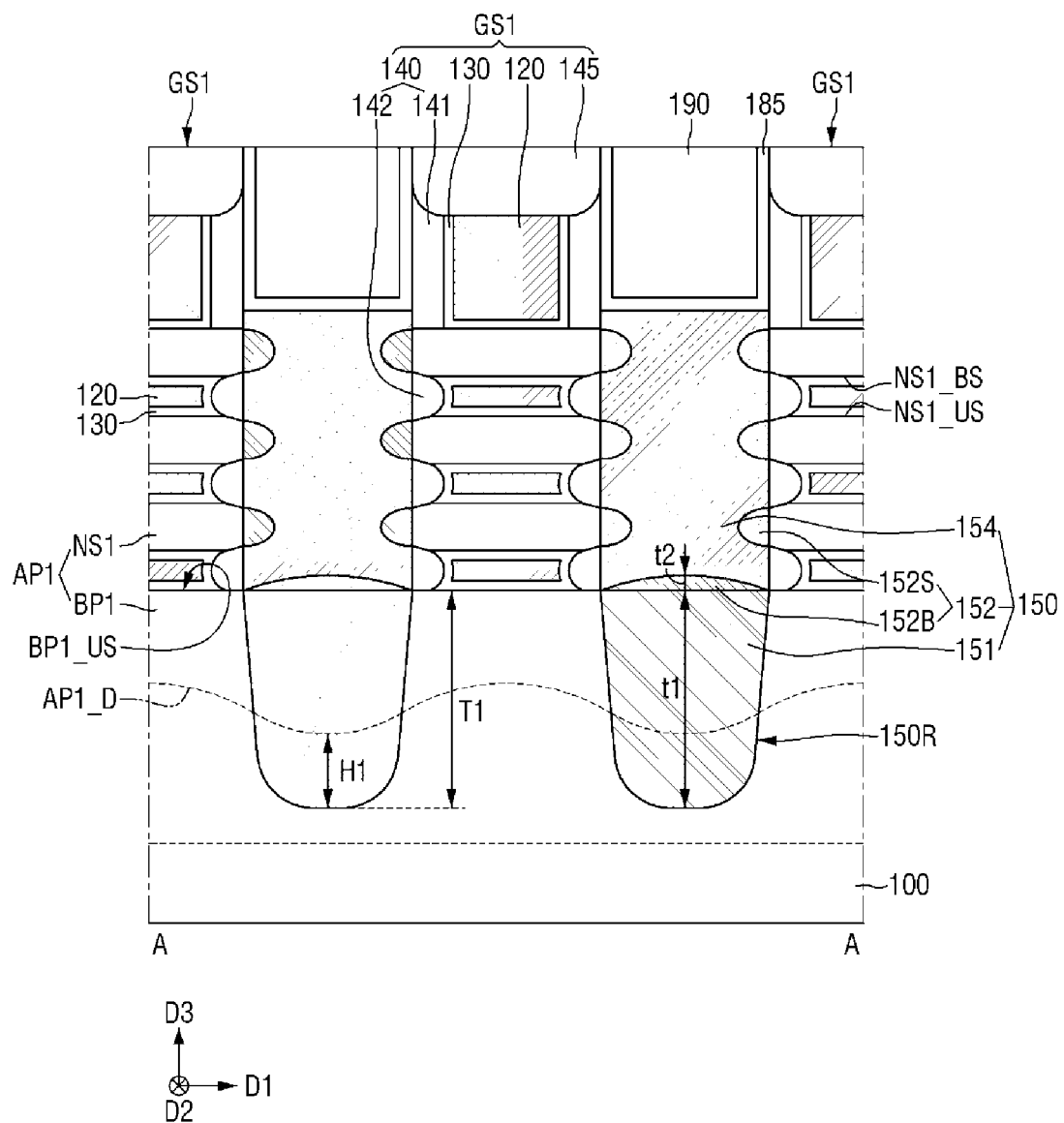
FIG. 2 is a cross-sectional view taken along line A-A of FIG. 1.
Figure 3:
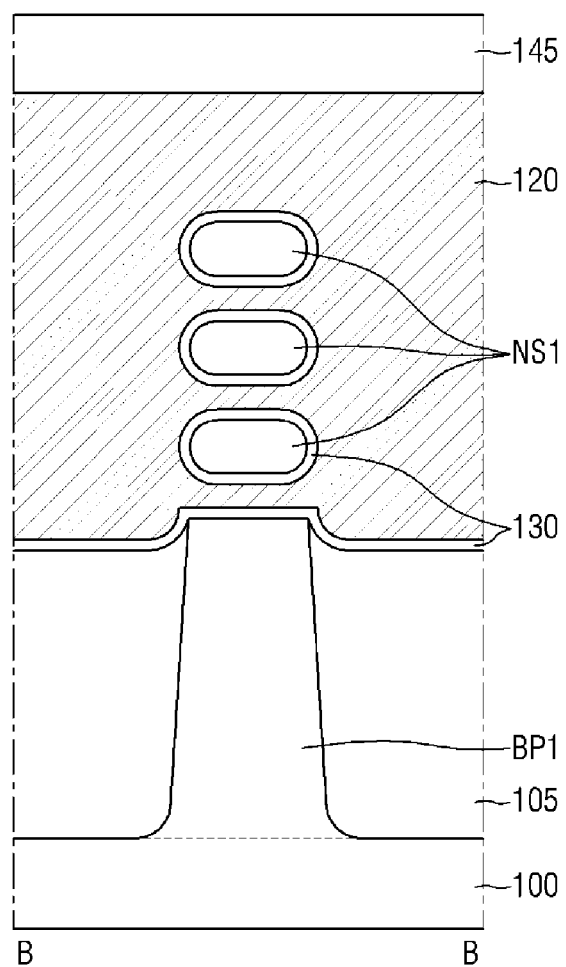
FIG. 3 is a cross-sectional view taken along line B-B of FIG. 1.
Figure 3:
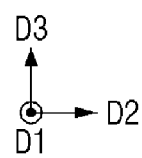
Figure 4:
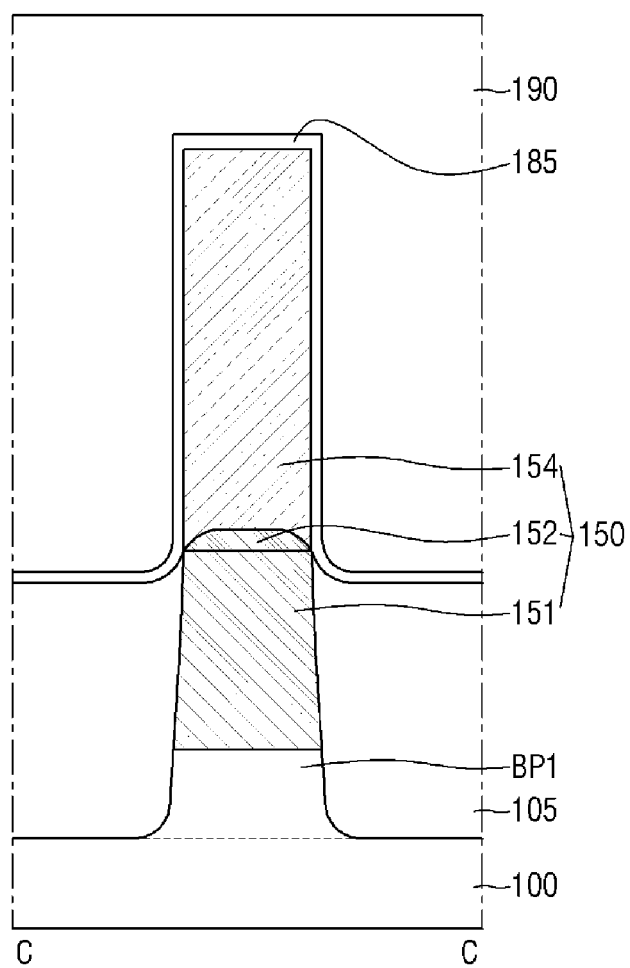
FIG. 4 is a cross-sectional view taken along line C-C of FIG. 1.
Figure 4:
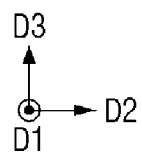

FIG. 1 is an exemplary layout diagram for describing a semiconductor device according to some exemplary embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1.

Referring to FIGS. 1 to 4, the semiconductor device according to some exemplary embodiments may include first active patterns AP1, first gate structures GS1, and first source/drain patterns 150.

A substrate 100 may be bulk silicon or silicon-on-insulator (SOI). Alternatively, the substrate 100 may be a silicon substrate or may include other materials such as silicon germanium, silicon germanium on insulator (SGOI), indium antimonide, lead tellurium compound, indium arsenide, indium phosphide, gallium arsenide, or gallium antimonide, but are not limited thereto.

The first active patterns AP1 may be disposed on the substrate 100. Each of the first active patterns AP1 may extend along in a first direction D1. For example, the first active pattern AP1 may be disposed in a region in which an N-channel metal oxide semiconductor (NMOS) is formed.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend to along in the first direction D1.

The plurality of first sheet patterns NS1 may be disposed on an upper surface BP1_US of the first lower pattern. The plurality of first sheet patterns NS1 may be spaced apart from the first lower pattern BP1 in a third direction D3. The respective first sheet patterns NS1 may be spaced apart from each other in the third direction D3.

Each of the first sheet patterns NS1 may include an upper surface NS1_US and a lower surface NS1_BS. The upper surface NS1_US of the first sheet pattern is a surface opposite to the lower surface NS1_BS of the first sheet pattern in the third direction D3. The third direction D3 may be a direction intersecting the first direction D1 and a second direction D2. For example, the third direction D3 may be a thickness direction of the substrate 100. The first direction D1 may be a direction intersecting the second direction D2.

It has been illustrated that three first sheet patterns NS1 are disposed in the third direction D3, but this is only for convenience of explanation, and the present disclosure is not limited thereto.

The first lower pattern BP1 may be formed by etching a portion of the substrate 100, and may include an epitaxial layer grown from the substrate 100. The first lower pattern BP1 may include silicon or germanium, which is an elemental semiconductor material. In addition, the first lower pattern BP1 may include a compound semiconductor, for example, a group IV-IV compound semiconductor or a group III-V compound semiconductor.

The group IV-IV compound semiconductor may be, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element.

The group III-V compound semiconductor may be, for example, one of a binary compound, a ternary compound, or a quaternary compound formed by combining at least one of aluminum (Al), gallium (Ga), and indium (In), which are group III elements, with one of phosphorus (P), arsenic (As), and antimony (Sb), which are group V elements.

The first sheet pattern NS1 may include one of silicon or germanium, which is an elemental semiconductor material, a group IV-IV compound semiconductor, or a group III-V compound semiconductor. Each of the first sheet patterns NS1 may include the same material as the first lower pattern BP1 or include a material different from that of the first lower pattern BP1.

In the semiconductor device according to some exemplary embodiments, the first lower pattern BP1 may be a silicon lower pattern including silicon, and the first sheet pattern NS1 may be a silicon sheet pattern including silicon.

Widths of the first sheet patterns NS1 in the second direction D2 may increase or decrease in proportion to a width of the first lower pattern BP1 in the second direction D2. It has been illustrated as an example that the widths, in the second direction, of the first sheet patterns NS1 stacked in the third direction D3 are the same as each other, this is only for convenience of explanation and the present disclosure is not limited thereto. Unlike as is shown and illustrated, a distance from the first lower pattern BP1 increases, the widths, in the second direction D2, of the first sheet patterns NS1 stacked in the third direction D3 may decrease.

A field insulating film 105 may be formed on the substrate 100. The field insulating film 105 may be disposed on sidewalls of the first lower pattern BP1. The field insulating film 105 is not disposed on the upper surface BP1_US of the first lower pattern.

As an example, the field insulating film 105 may entirely cover the sidewalls of the first lower pattern BP1. Unlike shown and illustrated, the field insulating film 105 may cover portions of the sidewalls of the first lower pattern BP1. In this case, portions of the first lower pattern BP1 may protrude further than an upper surface of the field insulating film 105 in the third direction D3.

Each of the first sheet patterns NS1 is disposed at a level above the upper surface of the field insulating film 105. The field insulating film 105 may include, for example, an oxide film, a nitride film, an oxynitride film, or a combination thereof. It has been illustrated that the field insulating film 105 is a single film, but this is only for convenience of explanation and the present disclosure is not limited thereto.

A plurality of first gate structures GS1 may be disposed on the substrate 100. Each of the first gate structures GS1 may extend in the second direction D2. The plurality of first gate structures GS1 adjacent to each other may be spaced apart from each other in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may surround each of the first sheet patterns NS1.

The first gate structure GS1 may include, for example, a first gate electrode 120, a first gate insulating film 130, a first gate spacer 140, and a first gate capping pattern 145.

The first gate electrode 120 may be formed on the first lower pattern BP1. The first gate electrode 120 may intersect the first lower pattern BP1. The first gate electrode 120 may surround the first sheet patterns NS1.

A portion of the first gate electrode 120 may be disposed between the first sheet patterns NS1 adjacent to each other in the third direction D3. When the first sheet pattern NS1 includes a first-first sheet pattern and a first-second sheet pattern adjacent to each other, a portion of the first gate electrode 120 may be disposed between an upper surface NS1_US of the first-first sheet pattern and a lower surface NS1_BS of the first-second sheet pattern facing each other.

The first gate electrode 120 may include at least one of a metal, a metal alloy, conductive metal nitride, metal silicide, a doped semiconductor material, conductive metal oxide, and conductive metal oxynitride. The first gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof, but is not limited thereto. The conductive metal oxide and the conductive metal oxynitride may include oxidized forms of the above-described materials, but are not limited thereto.

The first gate electrodes 120 may be disposed on both sides of a first source/drain pattern 150 to be described later. The first gate structures GS1 may be disposed on both sides of the first source/drain pattern 150 in the first direction D1.

As an example, both of the first gate electrodes 120 disposed on both sides of the first source/drain pattern 150 may be normal gate electrodes used as gates of transistors. As another example, the first gate electrode 120 disposed on one side of the first source/drain pattern 150 is used as a gate of a transistor, but the first gate electrode 120 disposed on the other side of the first source/drain pattern 150 may be a dummy gate electrode.

The first gate insulating film 130 may extend along the upper surface of the field insulating film 105 and the upper surface BP1_US of the first lower pattern. The first gate insulating film 130 may surround the first sheet pattern NS1. The first gate insulating film 130 may be disposed around a circumference of the first sheet pattern NS1. The first gate electrode 120 is disposed on the first gate insulating film 130. The first gate insulating film 130 is disposed between the first gate electrode 120 and the first sheet pattern NS1.

A portion of the first gate insulating film 130 may be disposed between the first sheet patterns NS1 adjacent to each other in the third direction D3. When the first sheet pattern NS1 includes the first-first sheet pattern and the first-second sheet pattern adjacent to each other, a portion of the first gate insulating film 130 may extend along the upper surface NS1_US of the first-first sheet pattern and the lower surface NS1_BS of the first-second sheet pattern facing each other.

The first gate insulating film 130 may include silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some exemplary embodiments may include a negative capacitance (NC) FET using a negative capacitor. For example, the first gate insulating film 130 may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected to each other in series and capacitances of each capacitor have a positive value, a total capacitance decreases as compared with a capacitance of each individual capacitor. On the other hand, when at least one of capacitances of two or more capacitors connected to each other in series has a negative value, a total capacitance may have a positive value and be greater than an absolute value of each individual capacitance.

When the ferroelectric material film having the negative capacitance and the paraelectric material film having the positive capacitance are connected to each other in series, a total capacitance value of the ferroelectric material film and the paraelectric material film connected to each other in series may increase. A transistor including the ferroelectric material film may have a subthreshold swing (SS) less than 60 mV/decade at room temperature, using the fact that the total capacitance value increases.

The ferroelectric material film may have ferroelectric characteristics. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may change depending on a type of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have paraelectric characteristics. The paraelectric material film may include, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include the same material. The ferroelectric material film may have ferroelectric characteristics, but the paraelectric material film may not have ferroelectric characteristics. For example, when the ferroelectric material film and the paraelectric material film include hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may change for each ferroelectric material, the thickness of the ferroelectric material film may change depending on a ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which a plurality of ferroelectric material films and a plurality of paraelectric material films are alternately stacked.

The first gate spacer 140 may be disposed on sidewalls of the first gate electrode 120. The first gate spacer 140 may include an outer spacer 141 and an inner spacer 142.

The inner spacer 142 may be disposed between the first sheet patterns NS1 adjacent in the third direction D3. The inner spacer 142 may be disposed between the first lower pattern BP1 and the first sheet pattern NS1 disposed at the lowermost portion.

The first gate insulating film 130 disposed between the first sheet patterns NS1 adjacent to each other may be in contact with the inner spacer 142. The first gate insulating film 130 may extend along a profile of the inner spacer 142.

A portion of the first sheet pattern NS1 that forms a boundary with the inner spacer 142 may have an inclined surface. A portion of the first sheet pattern NS1 may be etched in a process of manufacturing the inner spacer 142. That is, in FIG. 2, in the portion of the first sheet pattern NS1 that forms the boundary with the inner spacer 142, a thickness of the first sheet pattern NS1 in the third direction D3 may decrease as the first nanosheet SH 1 becomes closer to the first source/drain pattern 150.

Unlike shown and illustrated, in FIG. 2, in the portion of the first sheet pattern NS1 that forms the boundary with the inner spacer 142, a thickness of the first sheet pattern NS1 in the third direction D3 may be constant as the first nanosheet SH 1 becomes closer to the first source/drain pattern 150.

Each of the outer spacer 141 and the inner spacer 142 may include, for example, at least one of silicon nitride (SiN), silicon oxynitride (SiON), silicon oxide ($SiO_2$), silicon oxycarbonitride (SiOCN), or silicon boron nitride (SiBN), silicon oxyboron nitride (SiOBN), silicon oxycarbide (SiOC), and combinations thereof.

The first gate capping pattern 145 may be disposed on the first gate electrode 120 and the first gate spacer 140. An upper surface of the first gate capping pattern 145 may be coplanar with an upper surface of an interlayer insulating film 190. Unlike shown and illustrated, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etch selectivity with respect to the interlayer insulating film 190.

The first source/drain pattern 150 may be formed on the first active pattern AP1. The first source/drain pattern 150 may be formed on the first lower pattern BP1. The first source/drain pattern 150 may be connected to the first sheet pattern NS1. The first source/drain pattern 150 is in contact with the first sheet pattern NS1.

The first source/drain pattern 150 may be disposed on a side surface of the first gate structure GS1. The first source/drain pattern 150 may be disposed between the first gate structures GS1 adjacent to each other in the first direction D1. For example, the first source/drain patterns 150 may be disposed on both sides of the first gate structure GS1. Unlike shown and illustrated, the first source/drain pattern 150 may be disposed on one side of the first gate structure GS1 and may not be disposed on the other side of the first gate structure GS1.

The first source/drain pattern 150 may be included in a source/drain of a transistor that uses the first sheet pattern NS1 as a channel region.

The first source/drain pattern 150 may be disposed in a first source/drain recess 150R. The first source/drain recess 150R extends in the third direction D3. A lower surface of the first source/drain recess 150R may be defined by the first lower pattern BP1. A sidewall of the first source/drain recess 150R may be defined by the first sheet pattern NS1, the inner spacer 142, and the first gate structure GS1. The inner spacer 142 is disposed between the first gate electrode 120 between the first sheet patterns NS1 adjacent to each other and the first source/drain pattern 150. The first gate insulating film 130 is not in contact with the first source/drain pattern 150.

Between the first sheet pattern NS1 disposed at the lowermost portion and the first lower pattern BP1, a boundary between the first gate insulating layer 130 and the first lower pattern BP1 may be the upper surface BP1_US of the first lower pattern. In other words, in FIG. 2, the first gate structure GS1 may include a lowermost sub-gate structure disposed between the first lower pattern BP1 and the first sheet pattern NS1 disposed at the lowermost portion. The lowermost sub-gate structure may include a portion of the first gate electrode 120 and a portion of the first gate insulating film 130. The upper surface BP1_US of the first lower pattern may be a boundary between the lowermost sub-gate structure and the first lower pattern BP1. In this case, the lower surface of the first source/drain recess 150R is lower than the upper surface BP1_US of the first lower pattern.

A width of the first source/drain recess 150R, which is defined by the first sheet pattern NS1 and the inner spacer 142, in the first direction D1 may be constant. Unlike shown and illustrated, as an example, a width of the first source/drain recess 150R, which is defined by the lowermost sub-gate structure described above, in the first direction D1 may increase and then become constant as the first source/drain recess 150R becomes more distant from the upper surface BP1_US of the first lower pattern.

Unlike shown and illustrated, as another example, a width of the first source/drain recess 150R, which is defined by the first sheet pattern NS1 and the first gate structure GS1, in the first direction D1 may increase as the first source/drain recess 150R becomes more distant from the first lower pattern BP1.

Referring to FIG. 2, a depth T1 of the first source/drain recess 150R may be defined as a length of the first source/drain recess 150R extending in the third direction D3 from the upper surface BP1_US of the first lower pattern toward the substrate 100. The first source/drain recess 150R may be formed to be deeper in the third direction D3 than a doped region AP1_D of the first lower pattern BP1 doped with a semiconductor material. That is, the lower surface of the first source/drain recess 150R may be spaced apart from the doped region AP1_D by a first length H1, based on the third direction D3.

In the related art, when the first source/drain recess 150R is not sufficiently deep, there was a problem that the inner spacer 142 is formed in a region in which the first source/drain pattern 150 is to be formed. In the present exemplary embodiment, by forming the first source/drain recess 150R at the depth T1 greater than that in the related art, a leakage current may be reduced, and at the same time, a problem that the first source/drain pattern 150 is insufficiently formed due to the inner spacer 142 remaining in a central portion of the first source/drain recess 150R may be prevented.

The first source/drain pattern 150 may include an epitaxial region. The epitaxial region is formed of a semiconductor material. The epitaxial region may be formed of a semiconductor material pattern formed by an epitaxial growth method. The epitaxial region may include, for example, silicon doped with an n-type impurity.

In the semiconductor device according to some exemplary embodiments, the epitaxial region may include a plurality of first epitaxial regions 151, second epitaxial regions 152, and third epitaxial regions 154.

The first epitaxial region 151 may be disposed along a profile of the first source/drain recess 150R. The first epitaxial region 151 may be formed on the first lower pattern BP1.

The first epitaxial region 151 may be formed in the first source/drain recess 150R. As described later, an etching process of a first pre-side epitaxial region 151_P2 formed on a side surface of the first sheet pattern NS1 and a etching process of a first pre-lower epitaxial region 151_P1 formed on the first lower pattern BP1 are performed, such that a height of an upper surface of the first epitaxial region 151 may be lower than or the same as a height of an upper surface of the first source/drain recess 150R.

When the height of the upper surface of the first epitaxial region 151 is the same as the height of the upper surface of the first source/drain recess 150R, a thickness t1 of the first epitaxial region 151 in the third direction D3 may be defined as a distance from the upper surface BP1_US of the first lower pattern to the lower surface of the first source/drain recess 150R.

When the height of the upper surface of the first epitaxial region 151 is lower than the height of the upper surface of the first source/drain recess 150R, a distance from the upper surface BP1_US of the first lower pattern to the lower surface of the first source/drain recess 150R and a thickness t1 of the first epitaxial region 151 in the third direction D3 may be different from each other.

As an example, the first epitaxial region 151 may include a semiconductor material that is not doped. The first epitaxial region 151 may include undoped silicon. Here, the "undoped silicon" does not refer to silicon that does not include an impurity, but refers to silicon that does not include an intentionally doped impurity. The meaning of "undoped" is apparent to those skilled in the art.

As another example, the first epitaxial region 151 may include silicon doped with a p-type impurity. The p-type impurity may be, for example, boron (B), but is not limited thereto. The first epitaxial region 151 may include an impurity having a first concentration ($/cm^3$).

As another example, the first epitaxial region 151 may include silicon-germanium.

The second epitaxial region 152 may be disposed along a profile of the first source/drain recess 150R. The second epitaxial region 152 includes a second lower epitaxial region 152B in contact with the upper surface of the first epitaxial region 151 and a second side epitaxial region 152S in contact with the side surface of the first sheet pattern NS1. The respective second lower epitaxial regions 152B and the second side epitaxial regions 152S may be formed to be spaced apart from each other.

The second epitaxial region 152 may be formed on the first epitaxial region 151. The second lower epitaxial region 152B may not surround a side surface of the first epitaxial region 151. The second lower epitaxial region 152B may not be in contact with the side surface of the first epitaxial region 151.

The thickness t1 of the first epitaxial region 151 in the third direction D3 may be greater than a thickness t2 of the second lower epitaxial region 152B in the third direction D3.

The second side epitaxial regions 152S may be formed at ends of each of the first sheet patterns NS1 defining the first source/drain recesses 150R. The second side epitaxial regions 152S formed at the ends of each of the first sheet patterns NS1 may be spaced apart from each other. The second side epitaxial region 152S formed at the end of the first sheet pattern NS1 may not extend along the first source/drain recess 150R defined by the inner spacer 142.

For example, the second epitaxial region 152 may include silicon doped with a first n-type impurity. For example, the first n-type impurity may be arsenic (As). The first n-type impurity of the second epitaxial region 152 may have a second concentration ($/cm^3$). The second concentration ($/cm^3$) of the second epitaxial region 152 may be greater than the first concentration ($/cm^3$) of the first epitaxial region 151.

The third epitaxial region 154 may be interposed between the second epitaxial regions 152. The third epitaxial region 154 connects between the second lower epitaxial region 152B and the second side epitaxial region 152S spaced apart from each other. The third epitaxial region 154 is in contact with the second epitaxial region 152.

For example, the third epitaxial region 153 may include silicon doped with a second n-type impurity. The second n-type impurity may be different from the first n-type impurity. For example, the second n-type impurity may be phosphorus (P).

The second n-type impurity of the third epitaxial region 154 may have a third concentration ($/cm^3$). The third concentration ($/cm^3$) of the third epitaxial region 154 may be greater than the second concentration ($/cm^3$) of the second epitaxial region 152.

An etch stop film 185 may be disposed on the upper surface of the field insulating film 105, sidewalls of the first gate structure GS1, an upper surface of the first source/drain pattern 150, and sidewalls of the first source/drain pattern 150. The etch stop film 185 may include a material having an etch selectivity with respect to an interlayer insulating film 190 to be described later. The etch stop film 185 may include, for example, at least one of silicon nitride (SiN), silicon oxynitride (SiON), silicon oxycarbonitride (SiOCN), silicon boron nitride (SiBN), silicon oxyboron nitride (SiOBN), or silicon oxycarbide (SiOC), or combinations thereof.

The interlayer insulating film 190 may be disposed on the etch stop film 185. The interlayer insulating film may be disposed on the field insulating film 105 and the first source/drain pattern 150. The interlayer insulating film 190 may not cover the upper surface of the first gate capping pattern 145. For example, the upper surface of the interlayer insulating film 190 may be coplanar with the upper surface of the first gate capping pattern 145.

The interlayer insulating film 190 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthoSilicate (TMOS), octamethyleyclotetrasiloxane (OMCTS), hexamethyldisiloxane (HMDS), trimethylsilyl borate (TMSB), diacetoxyditeria-rybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or combinations thereof, but is not limited thereto.

Figure 5:
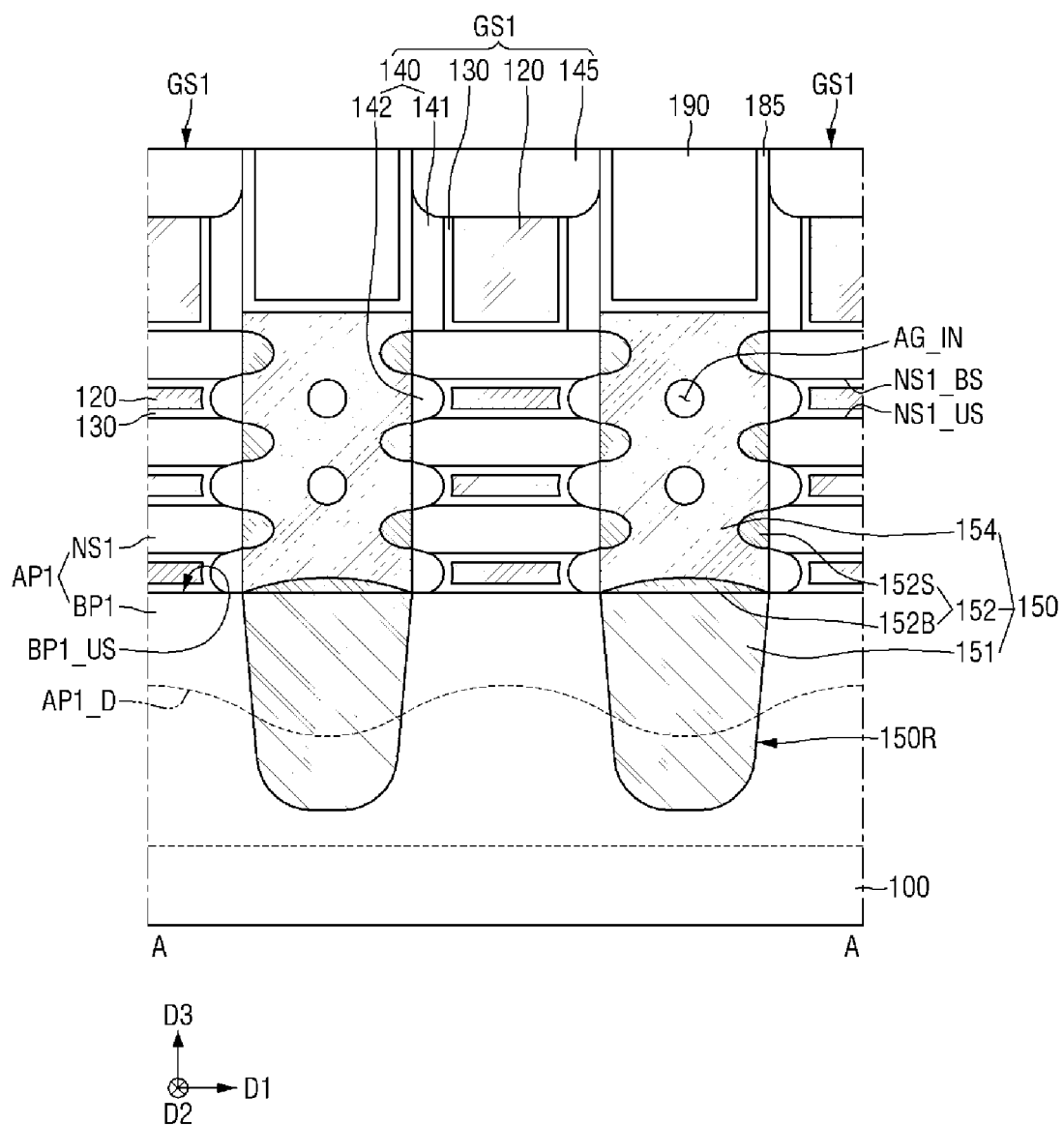
FIG. 5 is a cross-sectional view for describing a semiconductor device according to some exemplary embodiments, and is a cross-sectional view corresponding to FIG. 2.
Figure 6:
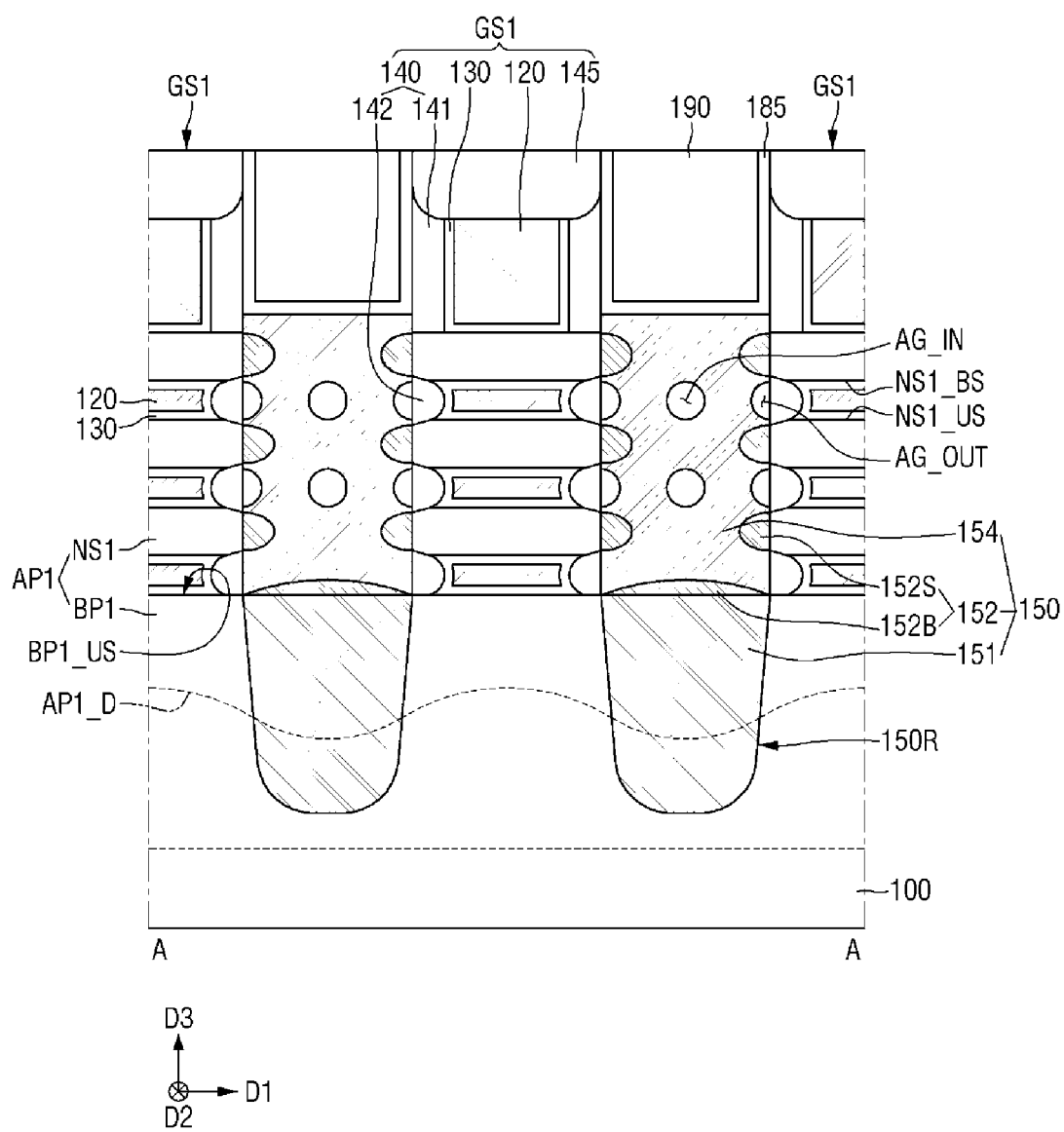
FIG. 6 is a cross-sectional view for describing a semiconductor device according to some exemplary embodiments, and is a cross-sectional view corresponding to FIG. 2.

FIG. 5 is a cross-sectional view for describing a semiconductor device according to some exemplary embodiments, and is a cross-sectional view corresponding to FIG. 2. FIG. 6 is a cross-sectional view for describing a semiconductor device according to some exemplary embodiments, and is a cross-sectional view corresponding to FIG. 2. For convenience of explanation, contents different from those described with reference to FIGS. 1 to 4 will be mainly described.

Referring to FIGS. 5 and 6, in the semiconductor device according to some exemplary embodiments, the epitaxial region may further include inner air gaps AG_IN.

Although not specifically illustrated, the semiconductor material forming the epitaxial region may entirely surround the cavity region in the epitaxial region. A surface of the cavity region may be defined by the semiconductor material forming the epitaxial region.

The cavity region is spatially spaced apart from the inner spacer 142 in the first direction D1. The surface of the cavity region does not include a portion defined by the inner spacer 142.

The cavity region may be disposed in the third epitaxial region 154. The cavity region is surrounded by the semiconductor material included in the third epitaxial region 154. The surface of the cavity region may be defined by the semiconductor material included in the third epitaxial region 154.

The cavity region may include the inner air gaps AG_IN. The inner air gap AG_IN is surrounded by the surface of the cavity region. The third epitaxial region 154 surrounds the entire inner air gap AG_IN. The semiconductor material included in the third epitaxial region 154 surrounds the entire inner air gap AG_IN.

The first gate electrode 120 disposed between the first sheet patterns NS1 adjacent to each other in the third direction D3 may overlap the inner air gap AG_IN in the first direction D1. The inner air gap AG_IN may overlap the inner spacer 142 in the first direction D1. The inner air gap AG_IN is not in contact with the inner spacer 142.

It has been shown and illustrated that the first source/drain pattern 150 includes two inner air gaps AG_IN, but the present disclosure is not limited thereto. Unlike shown and illustrated, the first source/drain pattern 150 may include one inner air gap AG_IN. Alternatively, the first source/drain pattern 150 may include three or more inner air gaps AG_IN.

Referring to FIG. 6, in the semiconductor device according to some exemplary embodiments, the epitaxial region may further include an outer air gap AG_OUT.

The outer air gap AG_OUT is surrounded by the inner spacer 142 and the epitaxial region. The outer air gap AG_OUT is surrounded by the inner spacer 142 and the third epitaxial region 154.

The outer air gap AG_OUT is in contact with the inner spacer 142. The outer air gap AG_OUT is surrounded by a surface of the inner spacer 142 and the semiconductor material included in the epitaxial region.

Unlike shown and illustrated, the outer air gap AG_OUT may be disposed in a portion between the inner spacer 142 and the first source/drain pattern 150.

Figure 7:
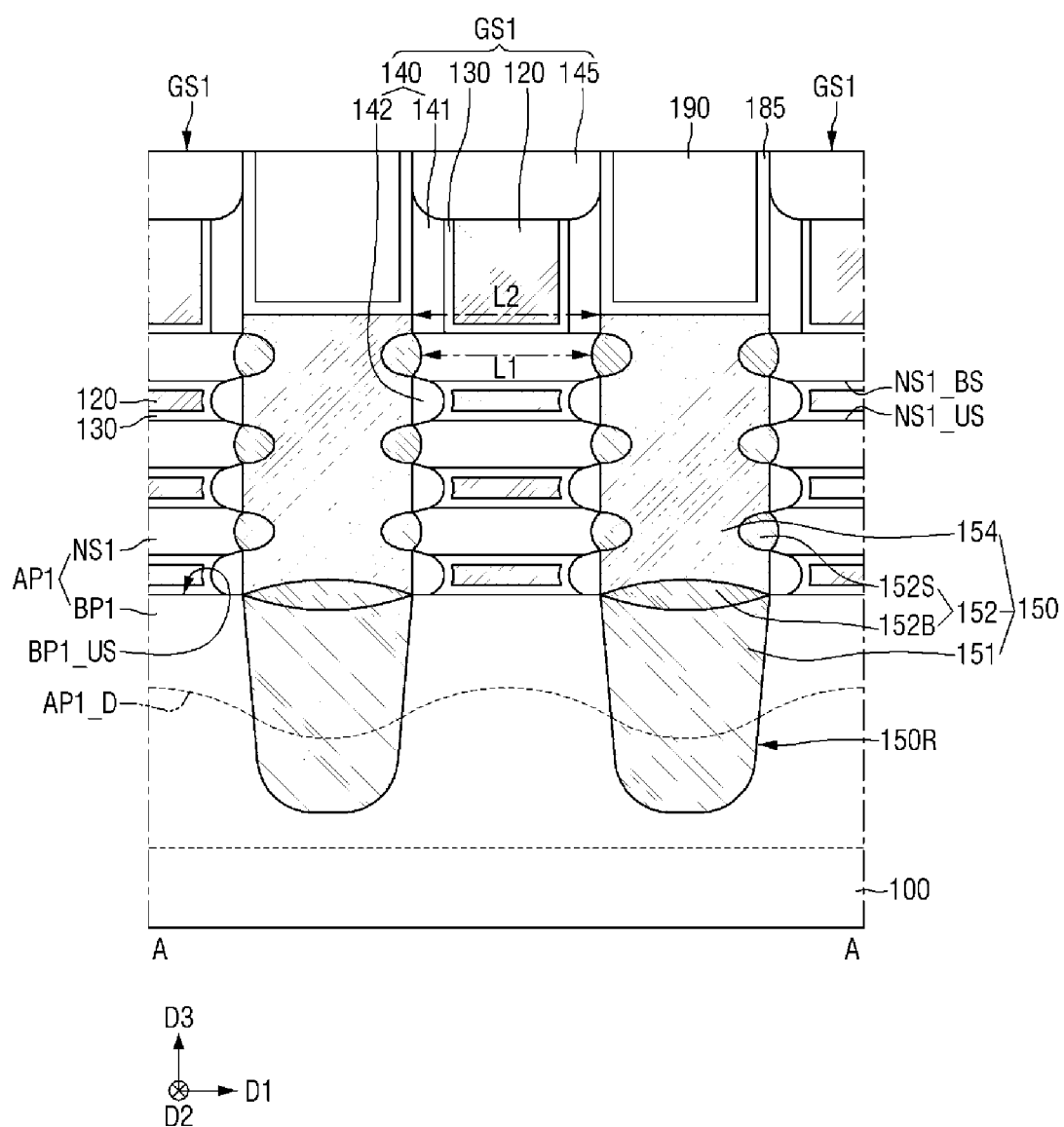
FIG. 7 is a cross-sectional view for describing a semiconductor device according to some exemplary embodiments, and is a cross-sectional view corresponding to FIG. 2.

FIG. 7 is a cross-sectional view for describing a semiconductor device according to some exemplary embodiments, and is a cross-sectional view corresponding to FIG. 2. For convenience of explanation, elements different from those described with reference to FIGS. 1 to 4 will be mainly described.

Referring to FIG. 7, in the semiconductor device according to some exemplary embodiments, concave parts CV may be formed in side surfaces of the first sheet patterns NS1.

The second epitaxial region 152 may be filled in the concave parts CV. Specifically, the second side epitaxial region 152S may be filled in side concave parts CV_S. The second lower epitaxial region 152B may be filled in a lower concave part CV_B.

The side concave part CV_S is formed, such that a length L1 of the first sheet pattern NS1 in the first direction D1 may be smaller than a length L2 of the first gate structure GS1 in the first direction D1.

Figure 8:
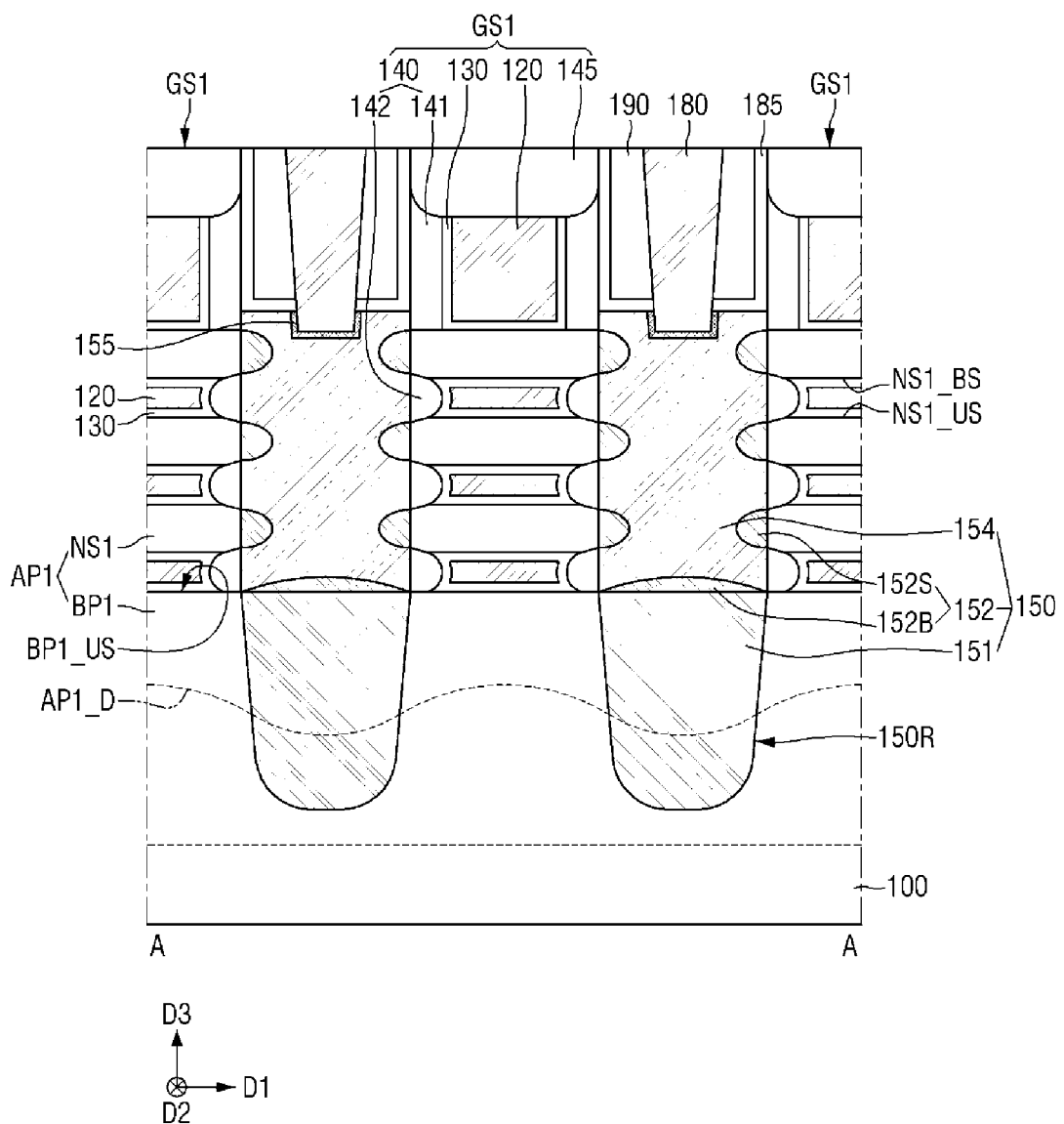
FIG. 8 is a cross-sectional view for describing a semiconductor device according to some exemplary embodiments, and is a cross-sectional view corresponding to FIG. 2.

FIG. 8 is a cross-sectional view for describing a semiconductor device according to some exemplary embodiments, and is a cross-sectional view corresponding to FIG. 2. For convenience of explanation, elements different from those described with reference to FIGS. 1 to 4 will be mainly described.

Referring to FIG. 8, the semiconductor device according to some exemplary embodiments may further include source/drain contacts 180 disposed on the first source/drain patterns 150.

The source/drain contact 180 is connected to the first source/drain pattern 150. The source/drain contact 180 may pass through the interlayer insulating film 190 and the etch stop film 185 and be connected to the first source/drain pattern 150.

A metal silicide film 155 may be further disposed between the source/drain contact 180 and the first source/drain pattern 150.

In FIG. 8, a bottom surface of the source/drain contact 180 may be higher than a lower surface of a nanosheet disposed at the uppermost portion of the first sheet pattern NS1.

In FIG. 8, the bottom surface of the source/drain contact 180 may be positioned between a lower surface of a sheet pattern disposed at the lowermost portion of the first sheet pattern NS1 and a lower surface of a sheet pattern disposed at the uppermost portion of the first sheet pattern NS1.

It has been shown and illustrated that the source/drain contact 180 is a single film, but this is only for convenience of explanation and the present disclosure is not limited thereto. The source/drain contact 180 may include, for example, at least one of a metal, a metal alloy, conductive metal nitride, conductive metal carbide, conductive metal oxide, conductive metal carbonitride, and a two-dimensional (2D) material.

The metal silicide film 155 may include metal silicide.

Figure 20:
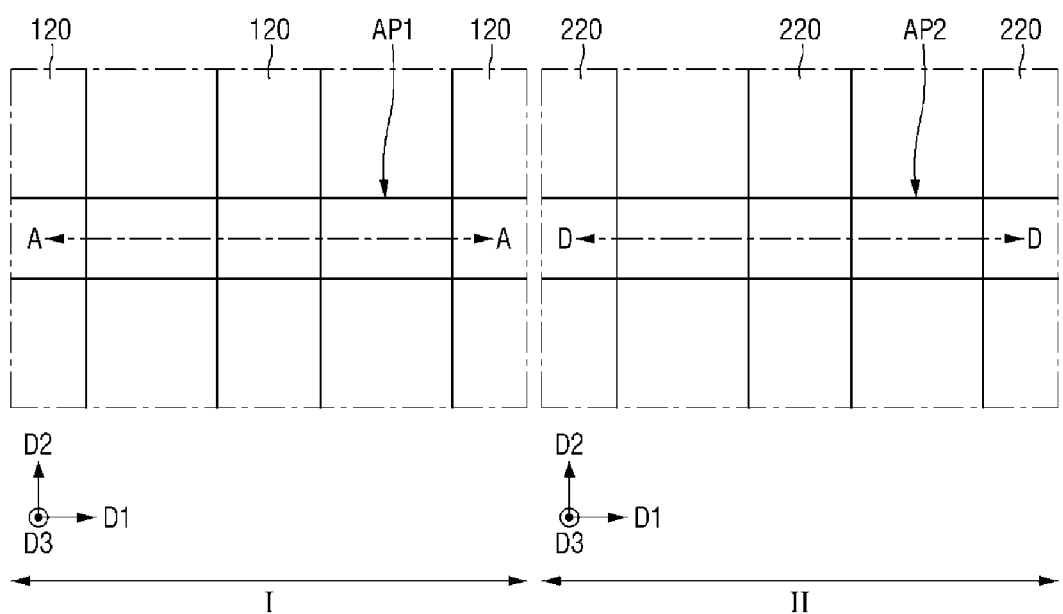
FIG. 20 is an exemplary layout diagram for describing a semiconductor device according to some exemplary embodiments.
Figure 21:
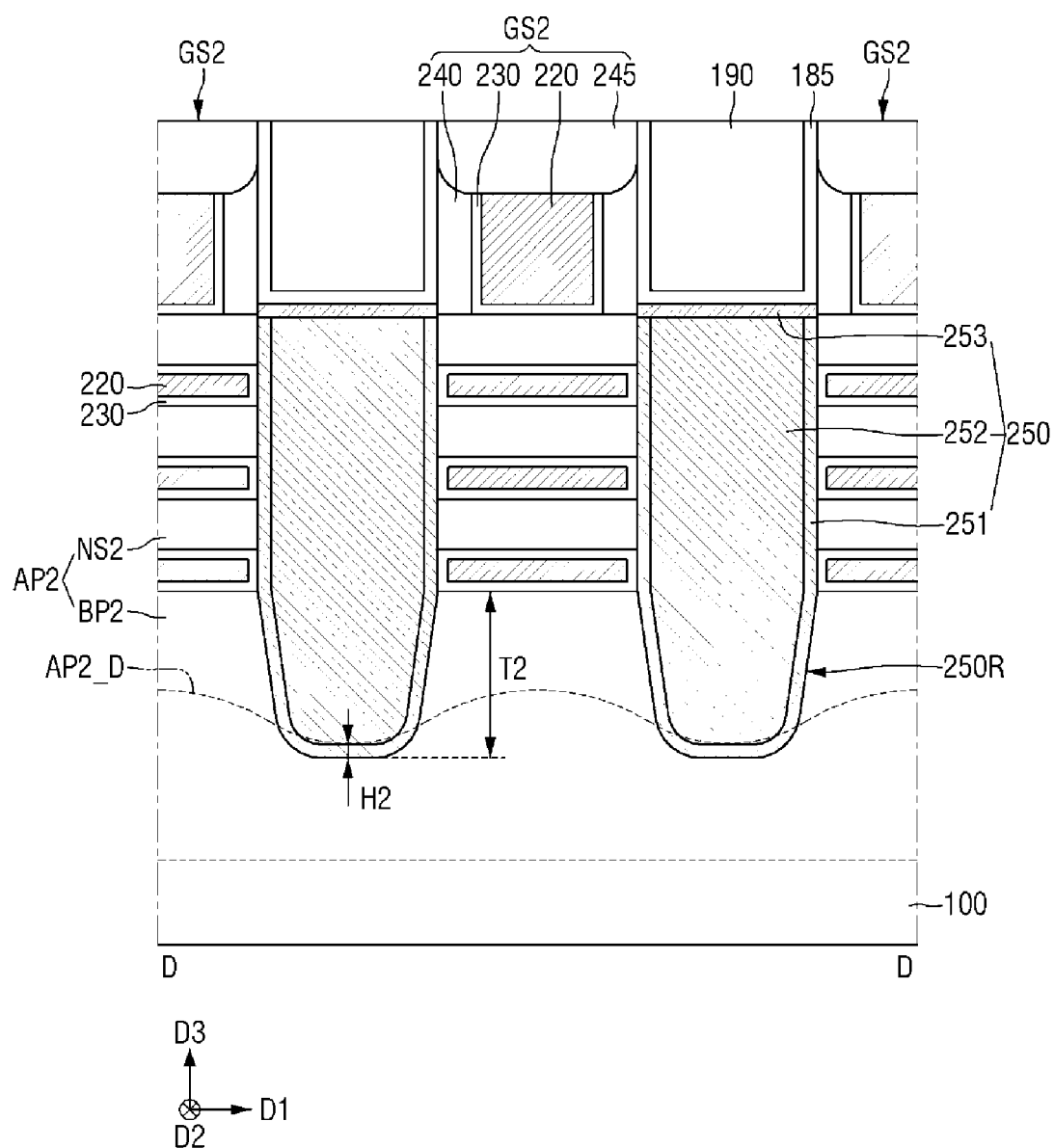
FIG. 21 is a cross-sectional view taken along line D-D of FIG. 20.

FIG. 20 is an exemplary layout diagram for describing a semiconductor device according to some exemplary embodiments. FIG. 21 is a cross-sectional view taken along line D-D of FIG. 20.

For reference, a cross-sectional view taken along line A-A of FIG. 20 may be the same as one of FIGS. 2 and 5 to 8. In addition, a description for a first region I of FIG. 20 may be substantially the same as that described with reference to FIGS. 1 to 8. Accordingly, the following description will be mainly focused on elements of a second region II of FIG. 20.

Referring to FIGS. 20 and 21, the semiconductor device according to some exemplary embodiments may include first active patterns AP1, a plurality of first gate structures GS1, first source/drain patterns 150, second active patterns AP2, a plurality of second gate structures GS2, and second source/drain patterns 250.

The substrate 100 may include a first region I and a second region II. The first region I may be a region in which an NMOS is formed, and the second region II may be a region in which a P-channel metal oxide semiconductor (PMOS) is formed.

The first active patterns AP1 and the plurality of first gate electrodes 120 are disposed in the first region I of the substrate 100. The second active patterns AP2 and the plurality of second gate electrodes 220 are disposed in the second region II of the substrate 100.

The second active pattern AP2 may include a second lower pattern BP2 and a plurality of second sheet patterns NS2. The second lower pattern BP2 may protrude from the substrate 100. The second lower pattern BP2 may extend to be along the first direction D1. The plurality of second sheet patterns NS2 may be disposed on the second lower pattern BP2. The plurality of second sheet patterns NS2 may be spaced apart from the second lower pattern BP2 in the third direction D3.

Each of the second lower pattern BP1 and the second sheet pattern NS2 may include one of silicon or germanium, which is an elemental semiconductor material, a group IV-IV compound semiconductor, or a group III-V compound semiconductor. In the semiconductor device according to some exemplary embodiments, the second lower pattern BP2 may be a silicon lower pattern including silicon, and the second sheet pattern NS2 may be a silicon sheet pattern including silicon.

The plurality of second gate structures GS2 may be disposed on the substrate 100. Each of the second gate structures GS2 may extend in the second direction D2. The second gate structures GS2 adjacent to each other may be spaced apart from each other in the first direction D1.

The second gate structure GS2 may be disposed on the second active pattern AP2. The second gate structure GS2 may intersect the second active pattern AP2. The second gate structure GS2 may intersect the second lower pattern BP2. The second gate structure GS2 may surround each of the second sheet patterns NS2.

The second gate structure GS2 may include, for example, a second gate electrode 220, a second gate insulating film 230, a second gate spacer 240, and a second gate capping pattern 245.

The second gate spacer 240 does not include the inner spacer 142 unlike the first gate spacer 140.

Descriptions for the second gate electrode 220, the second gate insulating film 230, the second gate spacer 240, and the second gate capping pattern 245 are substantially the same as the descriptions for the first gate electrode 120, the first gate insulating film 130, the first gate spacer 140, and the first gate capping pattern 145, and will thus be omitted as redundant.

The second source/drain pattern 250 may be formed on the second active pattern AP2. The second source/drain pattern 250 may be formed on the second lower pattern BP2. The second source/drain pattern 250 may be connected to the second sheet pattern NS2.

The second source/drain pattern 250 may be disposed on a side surface of the second gate structure GS2. The second source/drain pattern 250 may be disposed between the second gate structures GS2 adjacent to each other in the first direction D1. For example, the second source/drain patterns 250 may be disposed on both sides of the second gate structure GS2. Unlike shown and illustrated, the second source/drain pattern 250 may be disposed on one side of the second gate structure GS2 and may be absent on the other side of the second gate structure GS2.

The second source/drain pattern 250 may be included in a source/drain of a transistor that uses the second sheet pattern NS2 as a channel region.

The second source/drain pattern 250 may be disposed in a second source/drain recess 250R. A lower surface of the second source/drain recess 250R may be defined by the second lower pattern BP2. A sidewall of the second source/ drain recess 250R may be defined by a second sheet pattern NS2 and the second gate structure GS2.

Referring to FIG. 21, a depth T2 of the second source/drain recess 250R may be defined as a length of the second source/drain recess 250R extending in the third direction D3 from an upper surface of the second lower pattern BP2 toward the substrate 100. The second source/drain recess 250R may be formed to be deeper in the third direction D3 than a doped region AP2_D of the second lower pattern BP2 doped with a semiconductor material. That is, the lower surface of the second source/drain recess 250R may be spaced apart from the doped region AP2_D by a second length H2, based on the third direction D3

A depth of the source/drain may be smaller in the second region II in which the PMOS is formed than the first region I in which the NMOS is formed. The depth T1 of the first source/drain recess 150R may be greater than the depth T2 of the second source/drain recess 250R. As an example, the depth T1 of the first source/drain recess 150R may be twice the depth T2 of the second source/drain recess 250R, but the present disclosure is not limited thereto.

In addition, a spaced distance between the lower surface of the source/drain recess and the doped region may be smaller in the second region II than the first region I. That is, based on the third direction D3, a distance H1 between the lower surface of the first source/drain recess 150R and the first doped region AP1_D may be greater than a distance H2 between the lower surface of the second source/drain recess 250R and the second doped region AP2_D.

The second source/drain pattern 250 may include a lower semiconductor pattern 251, an upper semiconductor pattern 252, and a capping semiconductor pattern 253. Each of the lower semiconductor pattern 251, the upper semiconductor pattern 252, and the capping semiconductor pattern 253 may be an epitaxial semiconductor region.

Each of the lower semiconductor pattern 251 and the upper semiconductor pattern 252 may include silicon-germanium. In other words, each of the lower semiconductor pattern 251 and the upper semiconductor pattern 252 may include a silicon-germanium film. For example, a germanium fraction of the lower semiconductor pattern 251 is smaller than a germanium fraction of the upper semiconductor pattern 252.

Each of the lower semiconductor pattern 251 and the upper semiconductor pattern 252 may include a doped p-type impurity. The p-type impurity may be, for example, boron (B), but is not limited thereto.

The capping semiconductor pattern 253 may be formed on the lower semiconductor pattern 251 and the upper semiconductor pattern 252. The capping semiconductor pattern 253 may include, for example, silicon.

It has been shown and illustrated that a two-layer silicon-germanium semiconductor pattern is disposed below the capping semiconductor pattern 253, but this is only for convenience of explanation and the present disclosure is not limited thereto.

FIGS. 9 to 17 are intermediate step views for describing a method of manufacturing a semiconductor device according to some exemplary embodiments. For reference, FIGS. 9 to 17 may be views corresponding to cross-sectional views taken along line A-A of FIG. 1. The method of manufacturing a semiconductor device will be described in terms of a cross-sectional view.

Figure 9:
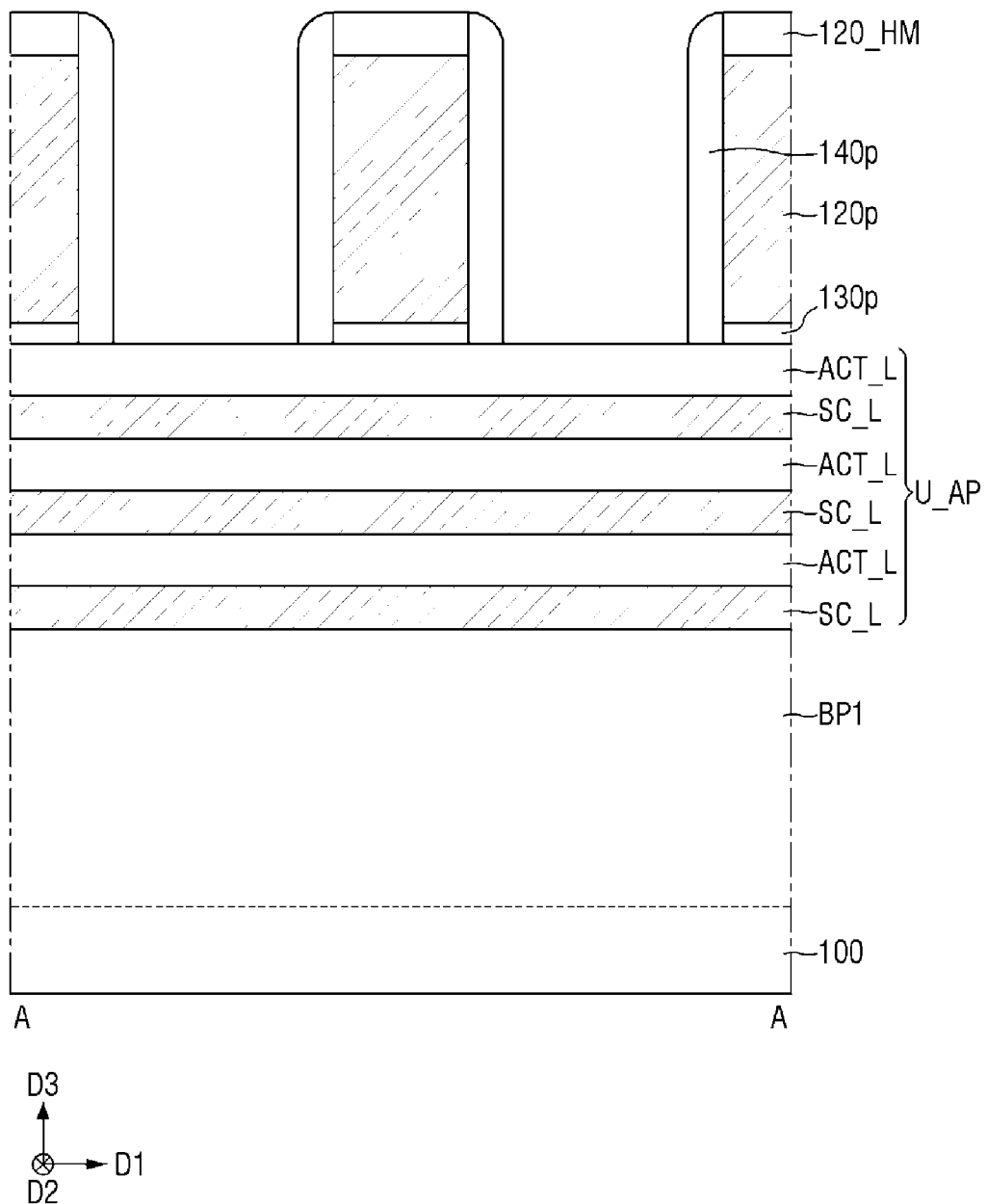
FIGS. 9 to 17 are intermediate step views for describing a method of manufacturing a semiconductor device according to some exemplary embodiments.

Referring to FIG. 9, a first lower pattern BP1 and an upper pattern structure U_AP may be formed on the substrate 100.

The upper pattern structure U_AP may be disposed on the first lower pattern BP1. The upper pattern structure U_AP may include sacrificial patterns SC_L and active patterns ACT_L alternately stacked on the first lower pattern BP1.

For example, the sacrificial pattern SC_L may include a silicon-germanium film. The active pattern ACT_L may include a silicon film.

Subsequently, a dummy gate insulating film 130$p$, a dummy gate electrode 120$p$, and a dummy gate capping layer 120_HM may be formed on the upper pattern structure U_AP. The dummy gate insulating film 130$p$ may include, for example, silicon oxide, but is not limited thereto. The dummy gate electrode 120$p$ may include, for example, polysilicon, but is not limited thereto. The dummy gate capping layer 120_HM may include, for example, silicon nitride, but is not limited thereto.

Pre-gate spacers 140$p$ may be formed on sidewalls of the dummy gate electrode 120$p$.

Figure 10:
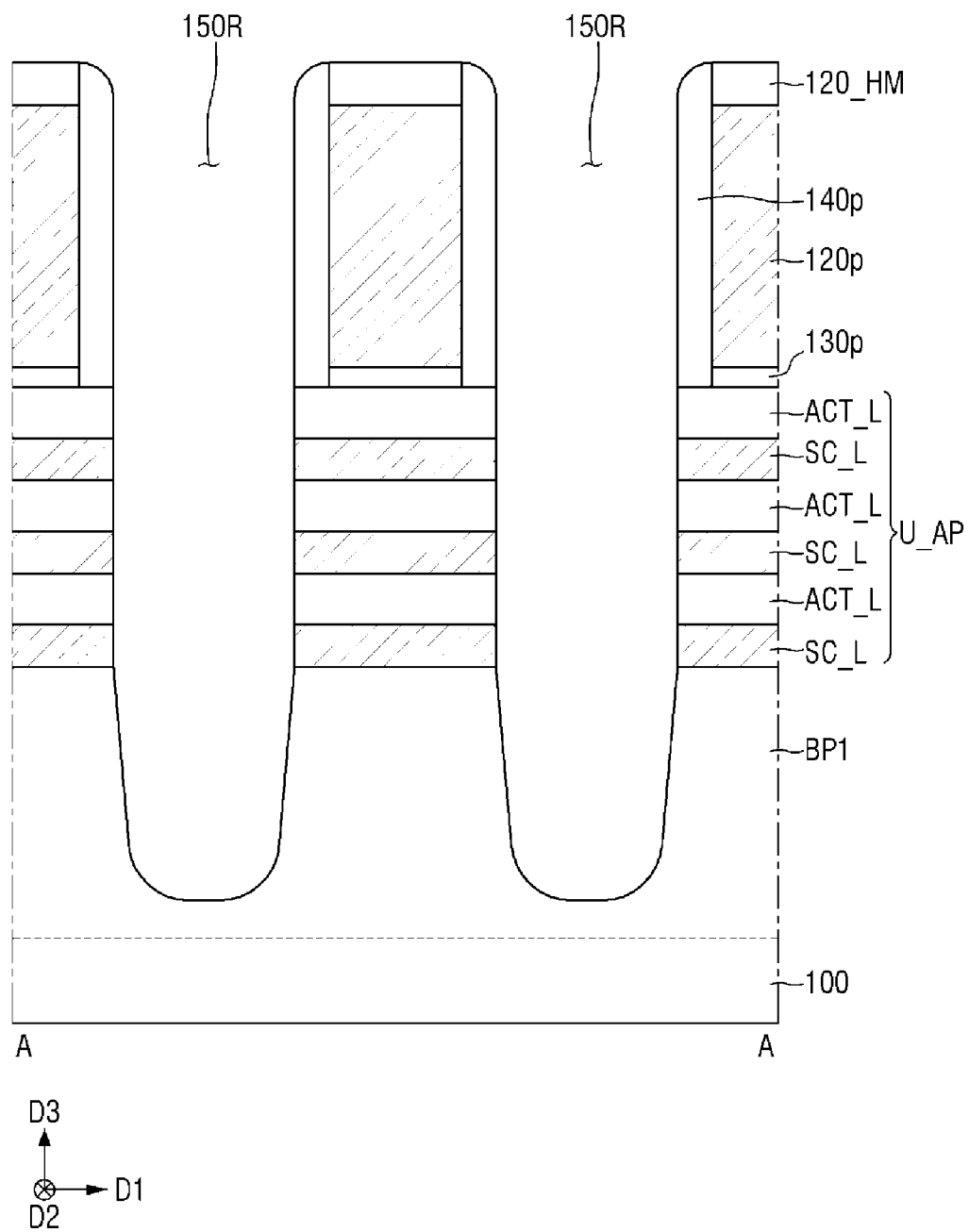

Referring to FIG. 10, first source/drain recesses 150R may be formed in the upper pattern structure U_AP using the dummy gate electrodes 120$p$ as a mask.

A portion of the first source/drain recess 150R may be formed in the first lower pattern BP1.

Figure 11:
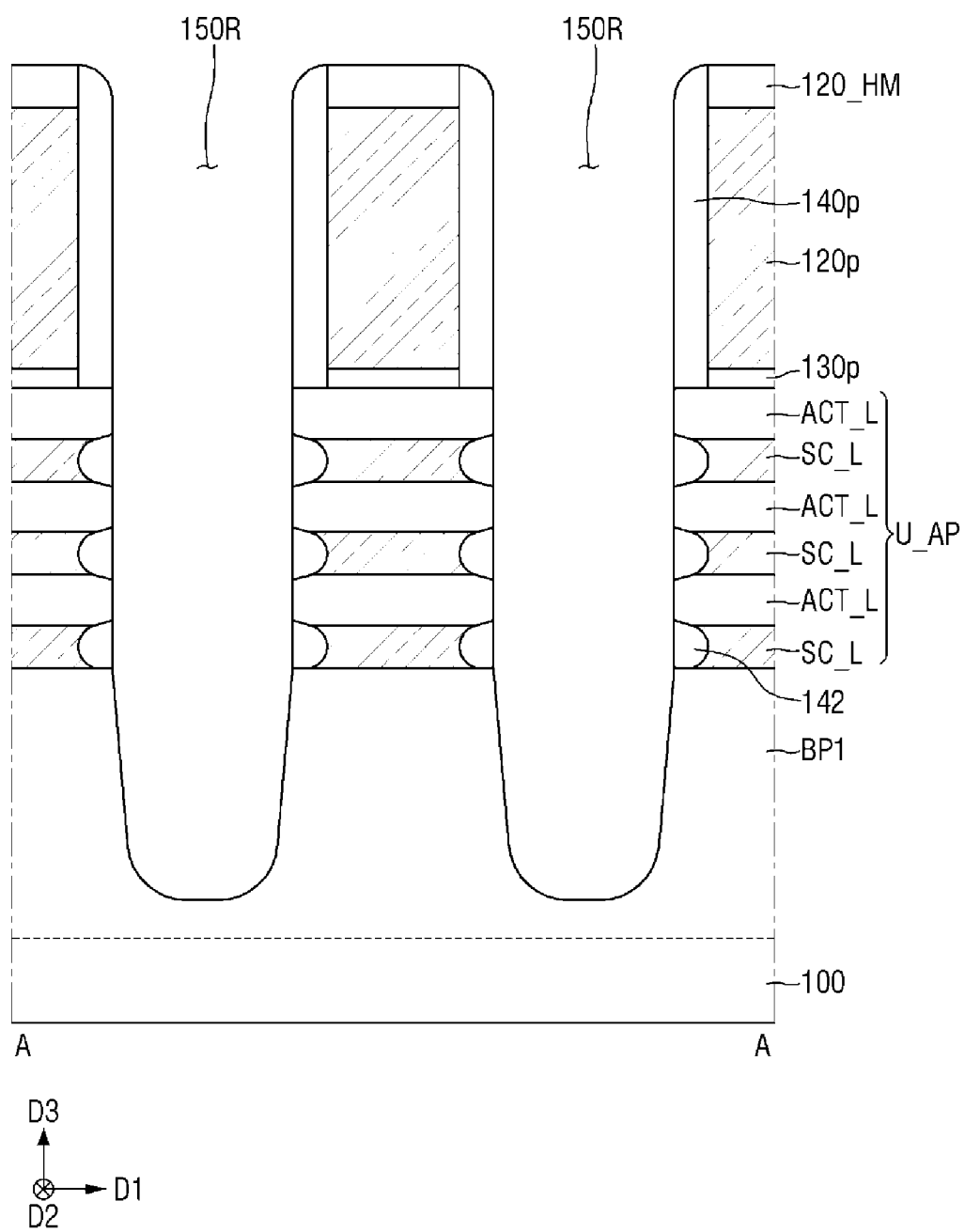

Referring to FIG. 11, portions of the sacrificial patterns SC_L exposed by the first source/drain recess 150R may be removed.

Subsequently, inner spacers 142 may be formed at positions where portions of the sacrificial patterns SC_L are removed.

Figure 12:
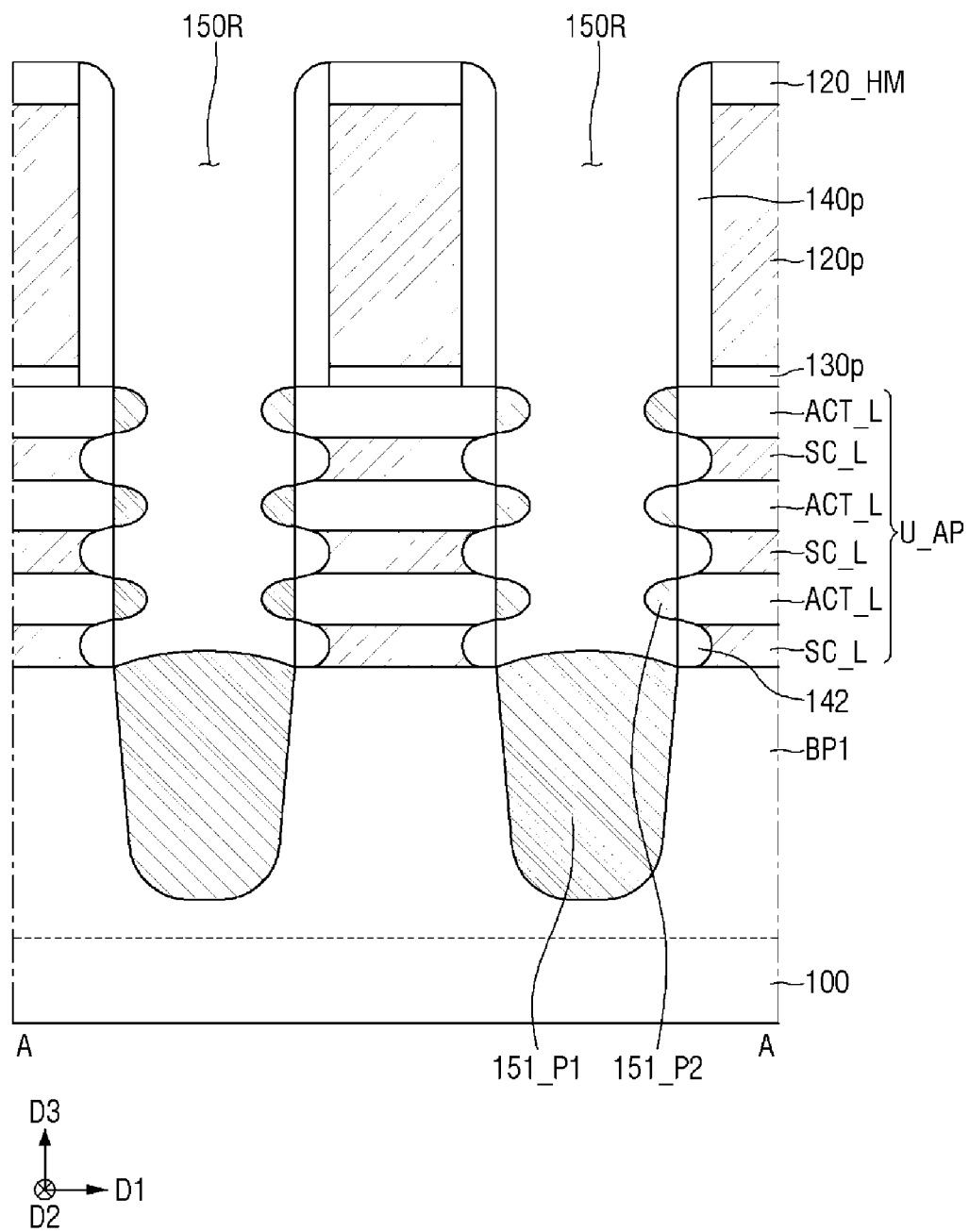

Referring to FIG. 12, a plurality of first pre-lower epitaxial regions 151_P1 and first pre-side epitaxial regions 151_P2 spaced apart from each other may be formed along profiles of the first source/drain recesses 150R.

The respective first pre-lower epitaxial regions 151_P1 and first pre-side epitaxial regions 151_P2 may be formed on the active patterns ACT_L and the first lower pattern BP1 exposed by the first source/drain recesses 150R.

Crystal faces of the exposed first lower pattern BP1 and active pattern ACT_L are different from each other, such that a growth rate of the first pre-lower epitaxial region 151_P1 may be higher than a growth rate of the first pre-side epitaxial region 151_P2.

Accordingly, a thickness of the first pre-lower epitaxial region 151_P1 formed in the first source/drain recess 150R may be greater than a thickness of the first pre-side epitaxial region 151_P2.

Figure 13:
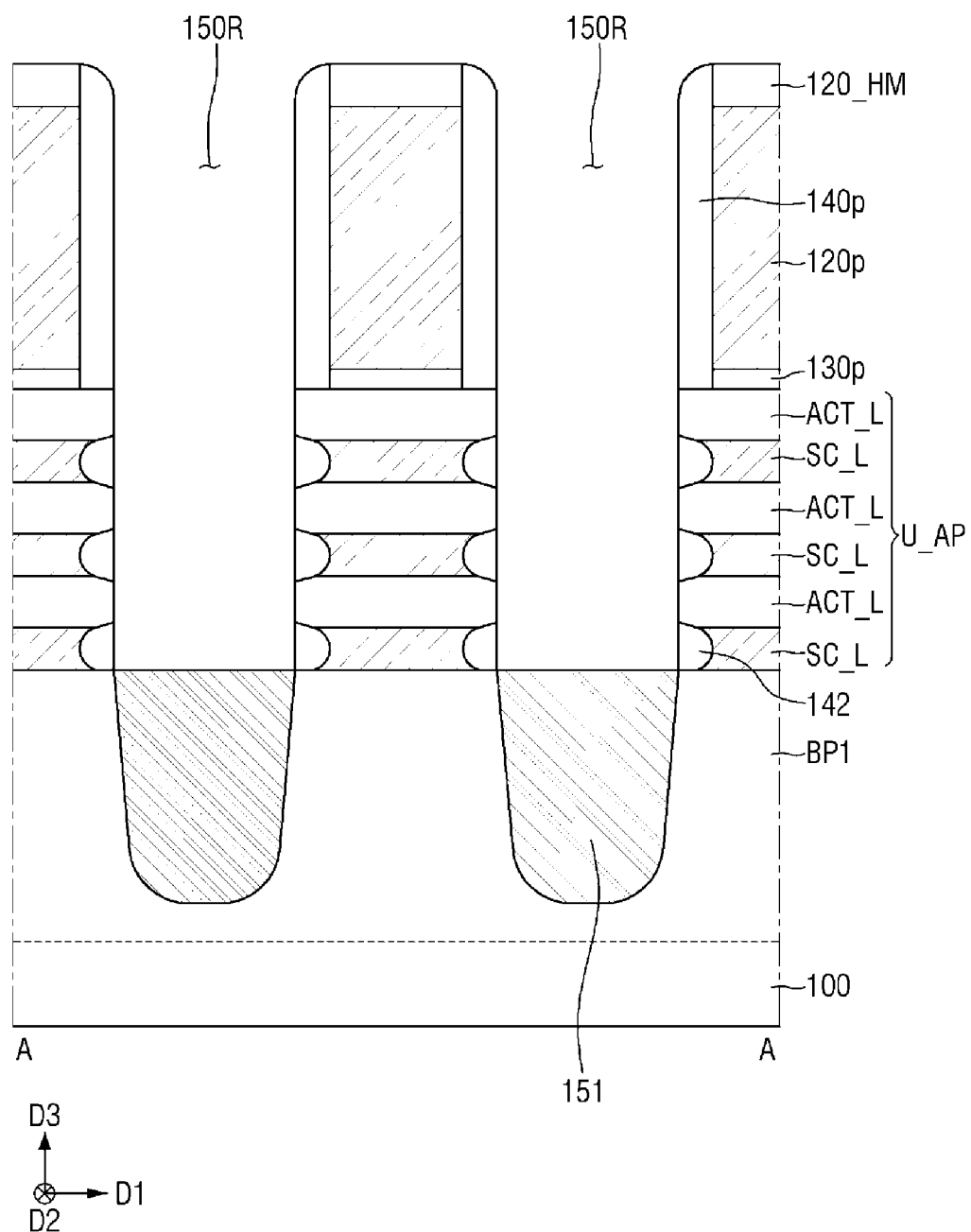

Referring to FIG. 13, the first pre-side epitaxial regions 151_P2 on the active patterns ACT_L may be removed.

At the same time, a portion of the first pre-lower epitaxial region 151_P1 on the first lower pattern BP1 may be removed.

A removal rate of the first pre-side epitaxial region 151_P2 formed adjacent to the inner spacer 142 may be higher than a removal rate of the first pre-lower epitaxial region 151_P1.

Accordingly, the first pre-lower epitaxial region 151_P1 may be selectively formed in the first source/drain recess 150R.

In addition, accordingly, a height of an upper surface of the first epitaxial region 151 may be the same as a height of an upper surface of the first source/drain recess 150R.

Figure 14:
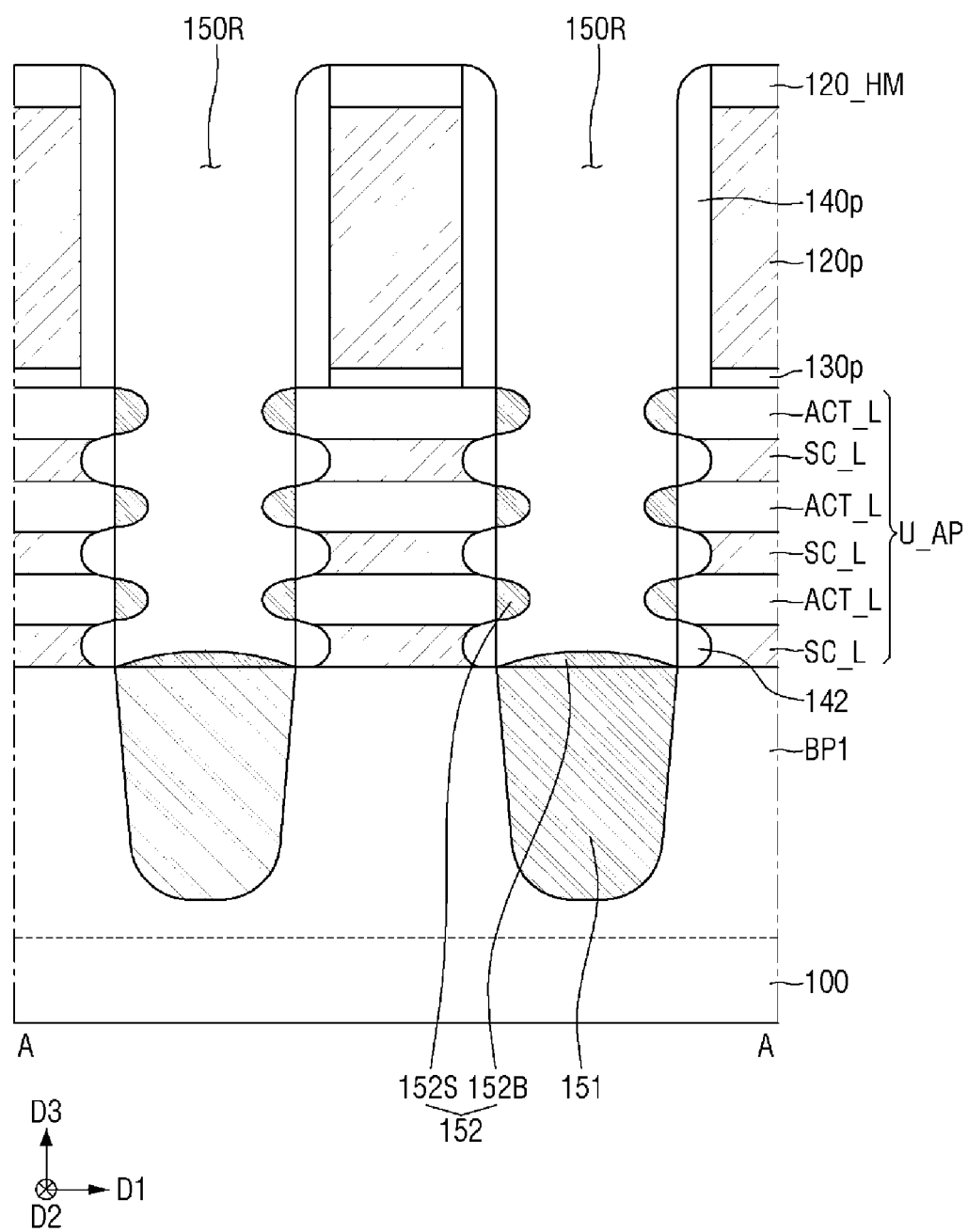

Referring to FIG. 14, the second epitaxial region 152 may be formed on the first epitaxial region 151.

Specifically, the second epitaxial region 152 includes a second lower epitaxial region 152B in contact with the upper surface of the first epitaxial region 151 and a second side epitaxial region 152S in contact with a side surface of the active pattern ACT_L. The respective second lower epitaxial regions 152B and the second side epitaxial regions 152S may be formed to be spaced apart from each other.

The second epitaxial region 152 may be formed on the first epitaxial region 151. The second lower epitaxial region 152B may be absent from a side surface of the first epitaxial region 151. The second lower epitaxial region 152B may not be in contact with the side surface of the first epitaxial region 151.

Referring to FIGS. 14 and 2 together, the thickness t1 of the first epitaxial region 151 in the third direction D3 may be greater than the thickness t2 of the second lower epitaxial region 152B in the third direction D3.

The second epitaxial region 152 may fill a portion of the first source/drain recess 150R. However, the second lower epitaxial region 152B formed on the first epitaxial region 151 and the second side epitaxial region 152S may be formed before being merged with each other.

Subsequently, the second lower epitaxial region 152B and the second side epitaxial region 152S may be continuously grown. As a result, the second epitaxial region 152 may be formed. Although not specifically shown and illustrated, a cavity region surrounded by the second epitaxial region 152 may be formed in the second epitaxial region 152.

That is, the first source/drain pattern 150 including an epitaxial region and a cavity region may be formed in the first source/drain recess 150R. The cavity region may include the inner air gaps AG_IN.

Figure 15:
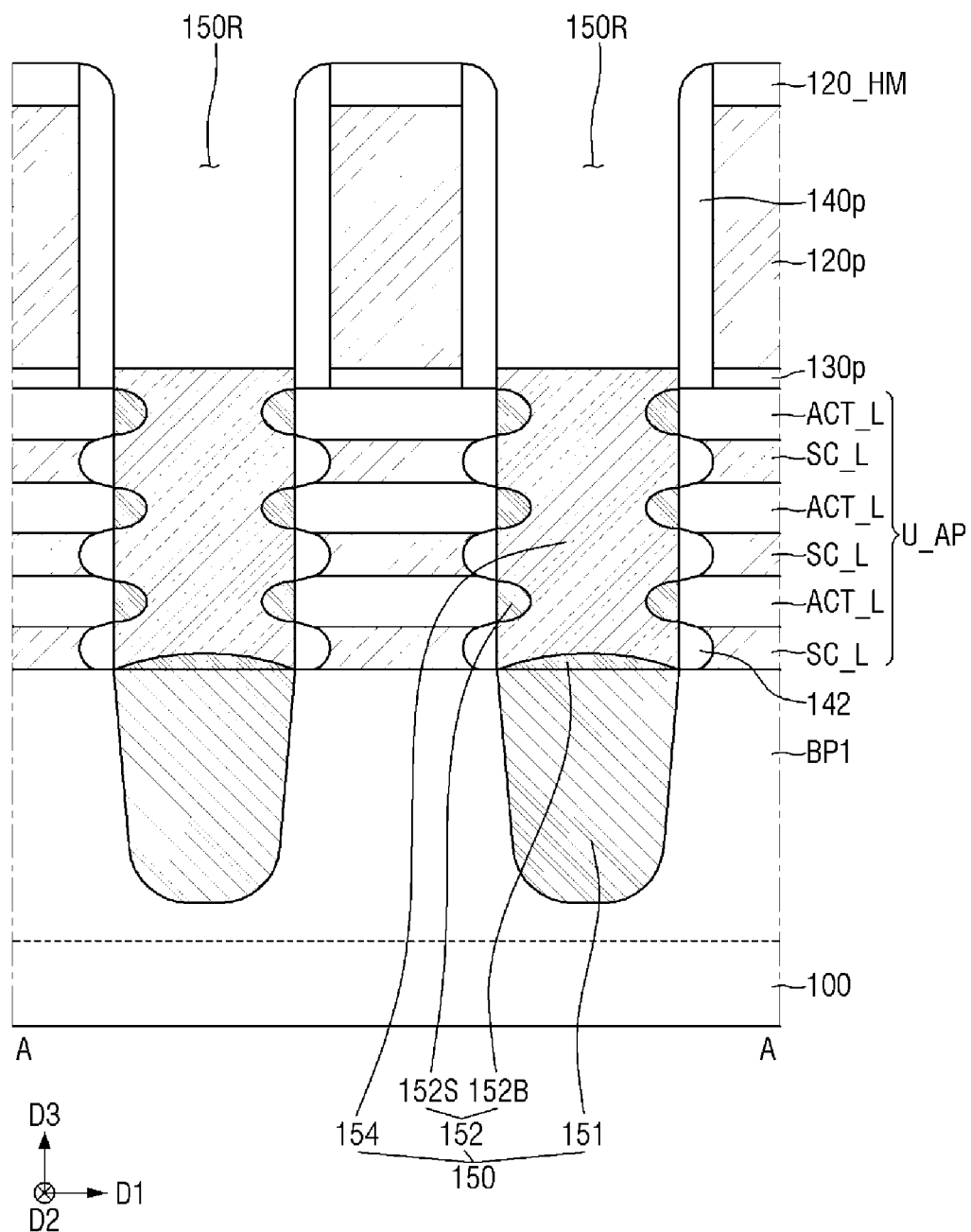

Referring to FIG. 15, the third epitaxial region 154 filling spaces between the second lower epitaxial regions 152B and the second side epitaxial region 152S is formed.

The third epitaxial region 154 connects between the second lower epitaxial region 152B and the second side epitaxial region 152S spaced apart from each other. The third epitaxial region 154 is in contact with the second epitaxial region 152.

Figure 16:
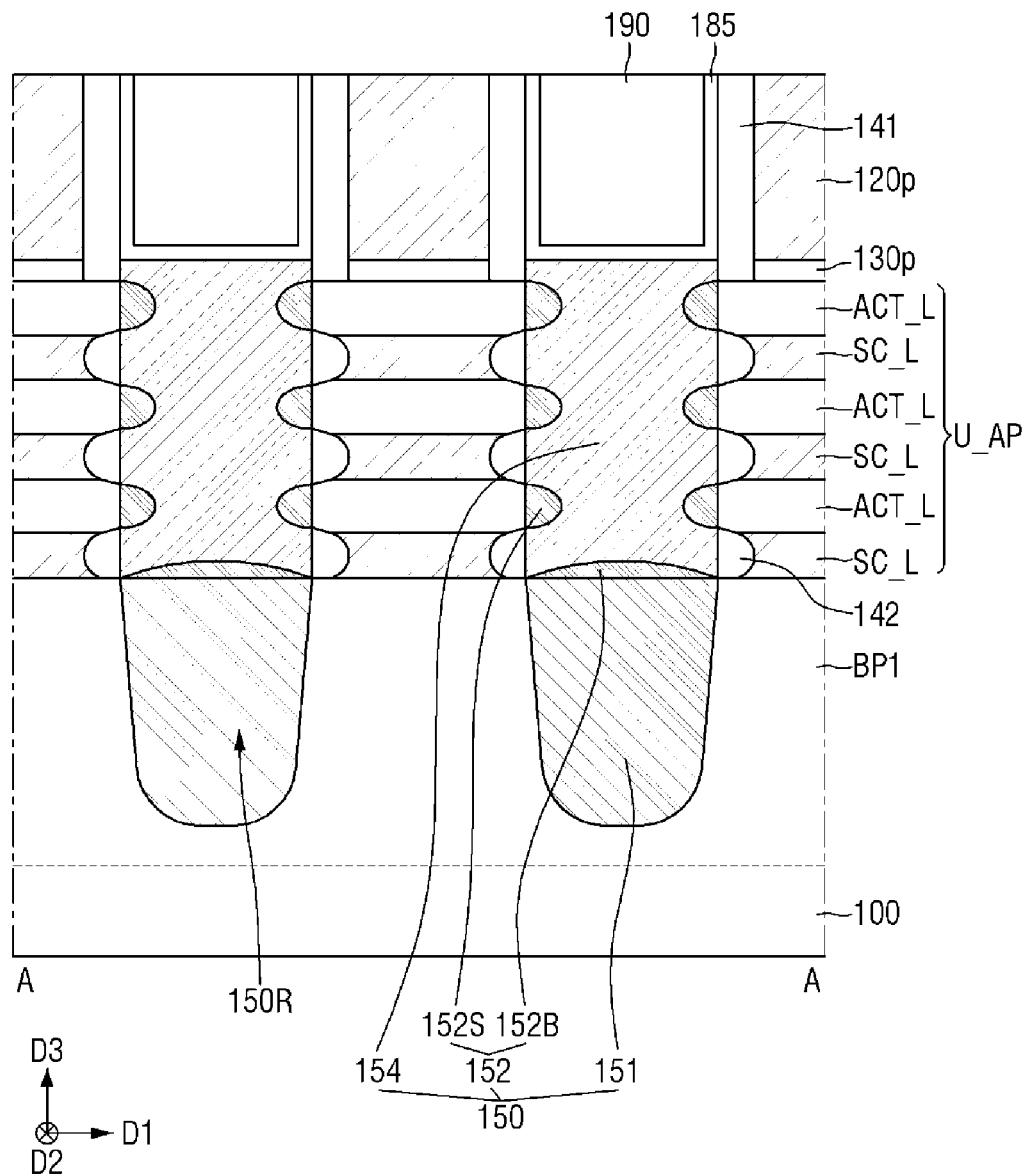

Referring to FIG. 16, the etch stop film 185 and the interlayer insulating film 190 are sequentially formed on the first source/drain pattern 150.

Subsequently, an upper surface of the dummy gate electrode 120p is exposed by removing a portion of the interlayer insulating film 190, a portion of the etch stop film 185, and the dummy gate capping layer 120_HM. The outer spacer 141 may be formed while the upper surface of the dummy gate electrode 120p is exposed.

Figure 17:
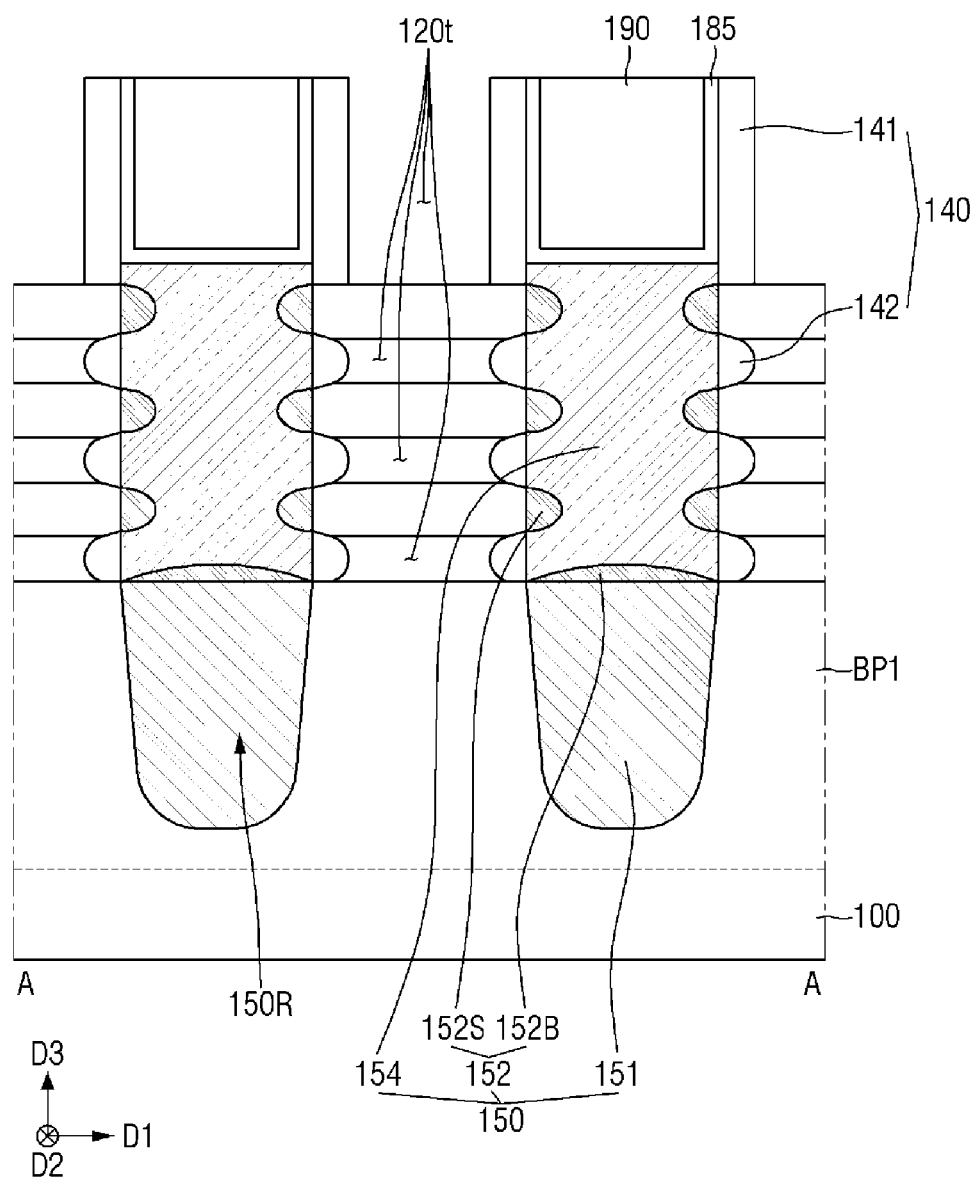

Referring to FIG. 17, the upper pattern structure U_AP between the first gate spacers 140 may be exposed by removing the dummy gate insulating film 130p and the dummy gate electrode 120p.

Subsequently, the first sheet patterns NS1 may be formed by removing the sacrificial patterns SC_L. As a result, a first gate trench 120t is formed between the first gate spacers 140. When the sacrificial patterns SC_L are removed, the inner spacers 142 may be exposed.

Subsequently, referring to FIG. 2, the first gate insulating film 130 and the first gate electrode 120 may be formed in the first gate trench 120t. In addition, the first gate capping pattern 145 may be formed.

Figure 18:
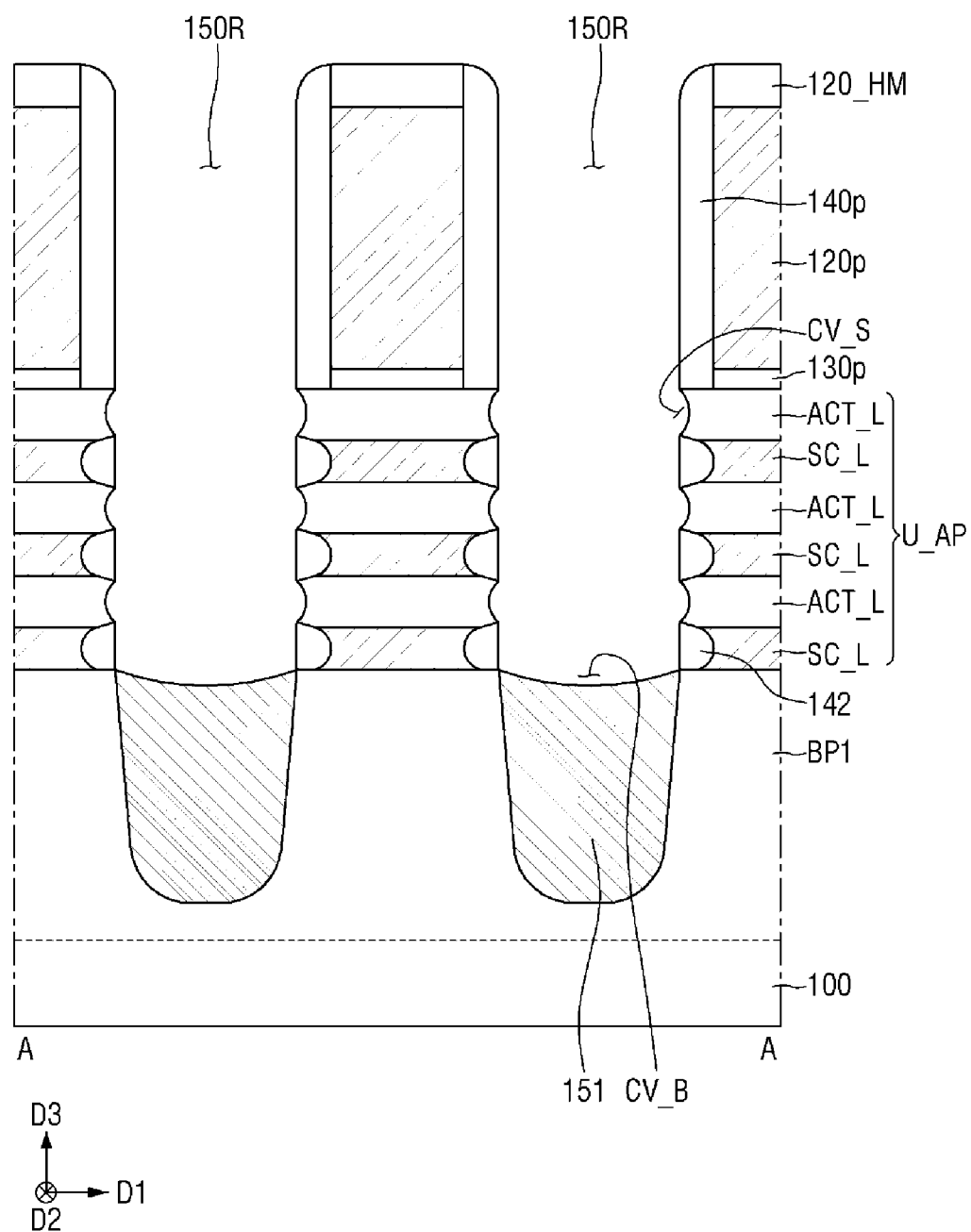
FIGS. 18 and 19 are intermediate step views for describing a method of manufacturing a semiconductor device according to some exemplary embodiments.
Figure 19:
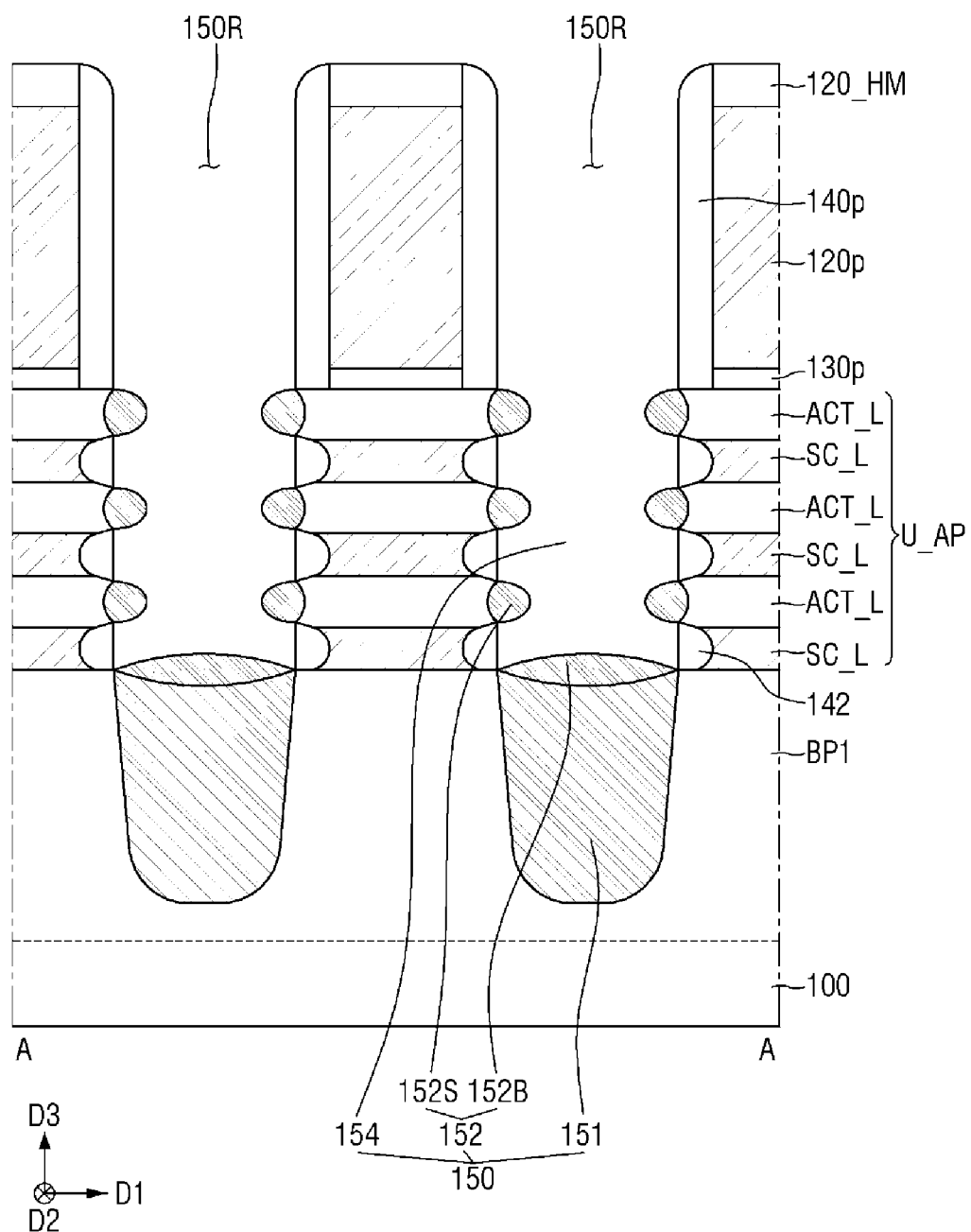

FIGS. 18 and 19 are intermediate step views for describing a method of manufacturing a semiconductor device according to some exemplary embodiments. For reference, FIGS. 18 and 19 may be cross-sectional views taken along line A-A of FIG. 1. The method of manufacturing a semiconductor device will be described in terms of a cross-sectional view. For convenience of explanation, elements different from those described with reference to FIGS. 9 to 17 will be mainly described.

Referring to FIG. 18, in a process of removing the first pre-side epitaxial regions 151_P2, at least portions of the active patterns ACT_L may be removed together with the first pre-side epitaxial regions 151_P2.

At the same time, a portion of the first pre-lower epitaxial region 151_P1 on the first lower pattern BP1 may be removed. Accordingly, a height of an upper surface of the first epitaxial region 151 may be lower than a height of an upper surface of the first source/drain recess 150R.

In addition, accordingly, side concave parts CV_S may be formed in side surfaces of the active patterns ACT_L. In addition, a lower concave part CV_B may be formed on the first epitaxial region 151.

Referring to FIG. 19, the second epitaxial region 152 may be filled in the concave parts CV.

Specifically, the second side epitaxial region 152S may be filled in the side concave parts CV_S. The second lower epitaxial region 152B may be filled in the lower concave part CV_B.

Referring to FIGS. 19 and 7 together, the side concave part CV_S is formed, such that the length L1 of the first sheet pattern NS1 in the first direction D1 may be smaller than the length L2 of the first gate structure GS1 in the first direction D1.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A semiconductor device comprising:
   a first active pattern including a first lower pattern and a plurality of first sheet patterns spaced apart from the first lower pattern in a first direction and having a first source/drain recess formed therein;
   a first source/drain pattern filling the first source/drain recess and in contact with the plurality of first sheet patterns on the first lower pattern; and
   first gate structures disposed on both sides of the first source/drain pattern in a second direction different from the first direction and each including first gate electrodes surrounding the plurality of first sheet patterns,
   wherein the first source/drain pattern includes:
      a first region on the first lower pattern,
      second regions including impurities of a conductivity type different from a conductivity type of the first region, wherein the second regions include a first portion in contact with the first region and second portions in contact with side surfaces of the plurality of first sheet patterns, and
      a third region between the second regions, and
   wherein a thickness of the first region in the first direction is greater than a thickness of the first portion of the second region in the first direction.

2. The semiconductor device of claim 1, wherein the first source/drain recess is disposed in the first lower pattern, and
   the first region is disposed in the first source/drain recess and in contact with the first lower pattern at a bottom surface of the first source/drain recess.

3. The semiconductor device of claim 1, wherein a height of an upper surface of the first region is lower than or the same as a height of an upper surface of the first lower pattern adjacent to the first source/drain recess.

4. The semiconductor device of claim 1, further comprising:

a second active pattern including a second lower pattern and a plurality of second sheet patterns;

a second source/drain pattern disposed on the second lower pattern, in contact with the second sheet patterns, and including impurities of a conductivity type different from that of the first source/drain pattern; and second gate structures disposed on both sides of the second source/drain pattern, wherein the second source/drain pattern is disposed in a second source/drain recess, and a depth of the first source/drain recess is greater than a depth of the second source/drain recess.

5. The semiconductor device of claim 1, wherein the first gate structures include a first inner spacer between a pair of the plurality of first sheet patterns that are adjacent to each other in the first direction, and wherein the first inner spacer is disposed between one of the first gate electrodes and the first source/drain pattern.

6. The semiconductor device of claim 1, wherein a side surface of one of the plurality of first sheet patterns comprises a concave portion, and a length of the one of the plurality of first sheet patterns in the second direction is smaller than a length of each of the first gate structures in the second direction.

7. The semiconductor device of claim 1, wherein the first region includes impurities that cause the conductivity type of the first region to be different from a conductivity type of the second regions and a conductivity type of the third region.

8. The semiconductor device of claim 7, wherein a concentration of the impurities in the first region is lower than a concentration of the impurities in the second regions, and the concentration of the impurities in the second regions is lower than a concentration of impurities in the third region.

9. The semiconductor device of claim 1, wherein the second regions include a first n-type impurity and the third region includes a second n-type impurity different from the first n-type impurity.

10. A semiconductor device comprising:

a first active pattern including a first lower pattern and a plurality of first sheet patterns spaced apart from the first lower pattern in a first direction;

a plurality of first gate structures spaced apart from each other in a second direction, different from the first direction, on the first lower pattern, and each including first gate electrodes surrounding the plurality of first sheet patterns;

a first source/drain recess defined between a pair of the plurality of first gate structures that are adjacent to each other in the first direction; and a first source/drain pattern disposed in the first source/drain recess on the first lower pattern, wherein the first gate structure further includes a first inner spacer between a pair of the plurality of first sheet patterns that are adjacent to each other in the first direction, wherein the first source/drain pattern includes:

a first semiconductor region on the first lower pattern, wherein the first semiconductor region contacts the first lower pattern at a bottom surface of the first source/drain recess, a plurality of second semiconductor regions composed of a same material, wherein the plurality of second semiconductor regions include a first portion on and in contact with the first semiconductor region and a plurality of second portions spaced apart from each other in the first direction and in contact with side surfaces of the plurality of first sheet patterns, and wherein the plurality of second semiconductor regions include impurities of a conductivity type different from a conductivity type of the first semiconductor region, and a third semiconductor region between the plurality of second semiconductor regions, and wherein the first to third semiconductor regions are sequentially disposed along the first direction, and the second and third semiconductor regions are sequentially disposed along the second direction.

11. The semiconductor device of claim 10, wherein the first semiconductor region is disposed in the first source/drain recess of the first lower pattern, and a height of an upper surface of the first semiconductor region is lower than or the same as a height of an upper surface of the first lower pattern adjacent to the first source/drain recess.

12. The semiconductor device of claim 10, further comprising:

a second active pattern including a second lower pattern and a plurality of second sheet patterns;

a second source/drain pattern disposed on the second lower pattern, in contact with the second sheet patterns, and including impurities of a conductivity type different from that of the first source/drain pattern; and second gate structures disposed on both sides of the second source/drain pattern, wherein the second source/drain pattern is disposed in a second source/drain recess, and a depth of the first source/drain recess is greater than a depth of the second source/drain recess.

* * * * *